US006872604B2

(12) United States Patent
Yamazaki et al.

(10) Patent No.: US 6,872,604 B2
(45) Date of Patent: Mar. 29, 2005

(54) METHOD OF FABRICATING A LIGHT EMITTING DEVICE

(75) Inventors: Shunpei Yamazaki, Tokyo (JP); Hideomi Suzawa, Kanagawa (JP); Koji Ono, Kanagawa (JP); Toru Takayama, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 641 days.

(21) Appl. No.: 09/871,944

(22) Filed: Jun. 4, 2001

(65) Prior Publication Data

US 2001/0049197 A1 Dec. 6, 2001

(30) Foreign Application Priority Data

Jun. 5, 2000 (JP) ........................................ 2000-168318

(51) Int. Cl.[7] .............................................. H01L 21/00
(52) U.S. Cl. ...................... 438/151; 438/155; 438/164; 438/180; 438/181
(58) Field of Search ................................ 438/151–155, 438/164, 180, 181, 527

(56) References Cited

U.S. PATENT DOCUMENTS

| 6,277,679 B1 | * | 8/2001 | Ohtani .................. 438/151 |
| 6,469,317 B1 | | 10/2002 | Yamazaki et al. ............. 257/59 |
| 6,706,544 B2 | | 3/2004 | Yamazaki et al. ............. 438/30 |
| 2002/0048829 A1 | | 4/2002 | Yamazaki et al. ............. 438/16 |

OTHER PUBLICATIONS

Tsutsui et al., "Electroluminescence in Organic Thin Films", Photochemical Processes in Organized Molecular Systems, 1991, pp. 437–450.
M. A. Baldo et al., "Highly Efficient Phosphorescent Emission from Organic Electroluminescent Devices", Nature vol. 395, Sep. 10, 1998, pp. 151–154.
M. A. Baldo et al., "Very High–Efficiency Green Organic Light–Emitting Devices Based on Electrophosphorescence", Applied Physics Letters vol. 75, No. 1, Jul. 5, 1999, pp. 4–6.
Tsutsui et al., "High Quantum Efficiency in Organic Light–Emitting Devices with Iridium–Complex as a Triplet Emissive Center", Japanese Journal of Applied Physics vol. 38, Part 12B, Dec. 15, 1999, pp. L1502–L1504.
Japanese Patent Application Laid–Open No. 2000–228527 (English Abstract attached).
Japanese Patent Application Laid–Open No. 2001–094113 (English Abstract attached).

* cited by examiner

Primary Examiner—Hsien-Ming Lee
(74) Attorney, Agent, or Firm—Fish & Richardson P.C.

(57) ABSTRACT

There is provided an inexpensive light emitting device and an electronic instrument using the same. In this invention, photolithography steps relating to manufacture of a transistor are reduced, so that the yield of the light emitting device is improved and the manufacturing period thereof is shortened. A feature is that a gate electrode is formed of conductive films of plural layers, and by using the selection ratio of those at the time of etching, the concentration of an impurity region formed in an active layer is adjusted.

32 Claims, 20 Drawing Sheets

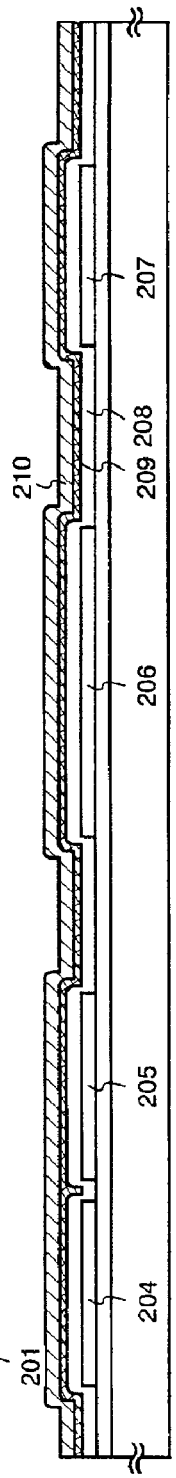
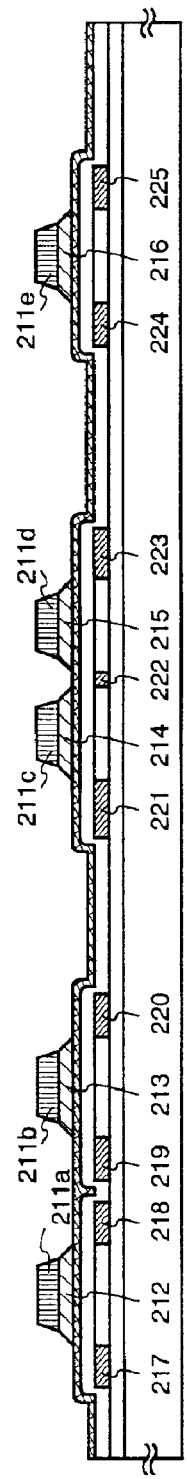
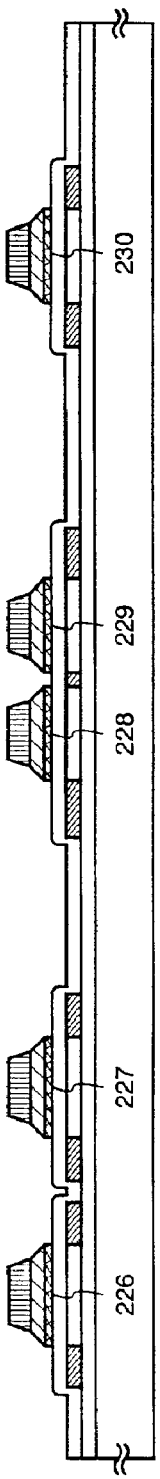
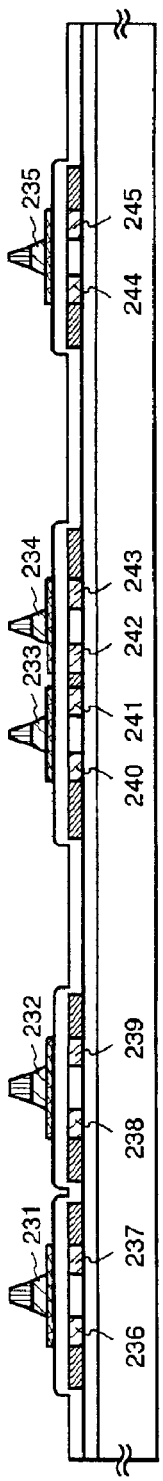
Fig. 2A
Fig. 2B
Fig. 2C
Fig. 2D
Fig. 2E

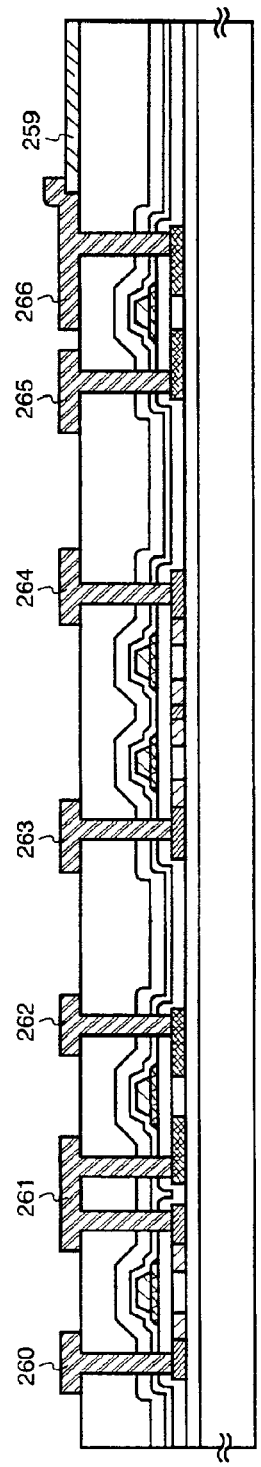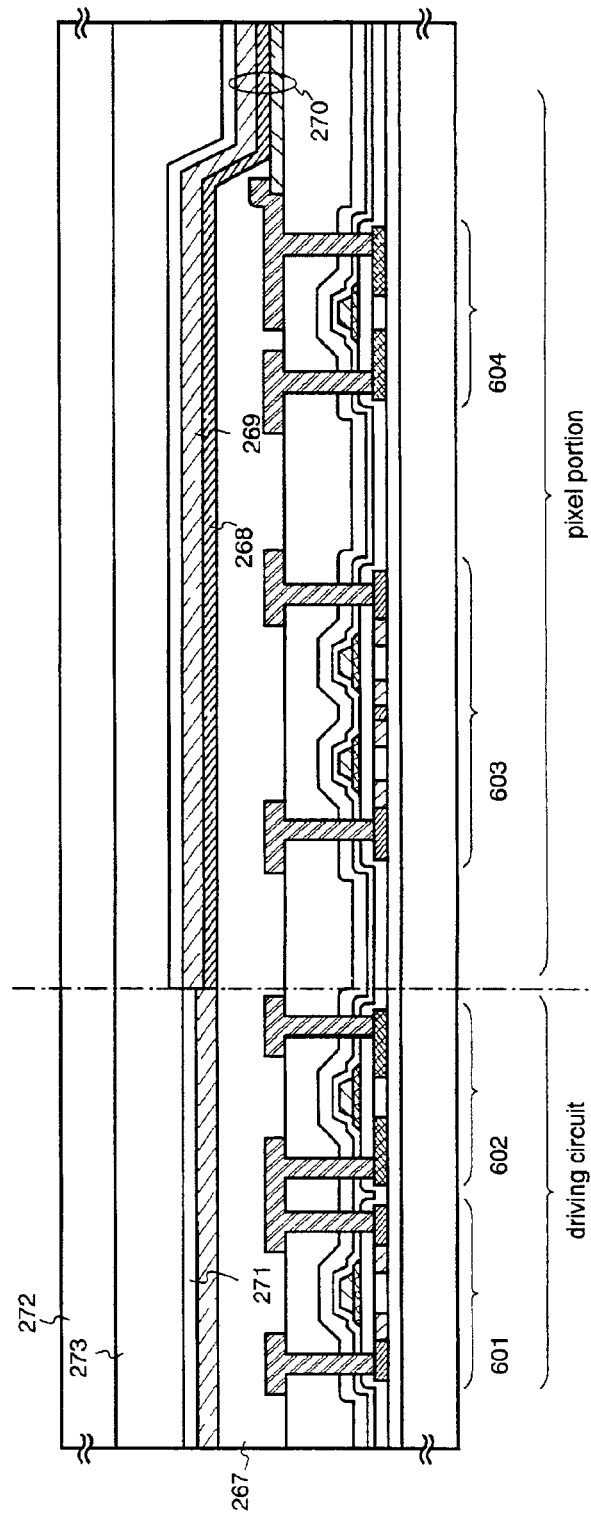
Fig. 4A
Fig. 4B

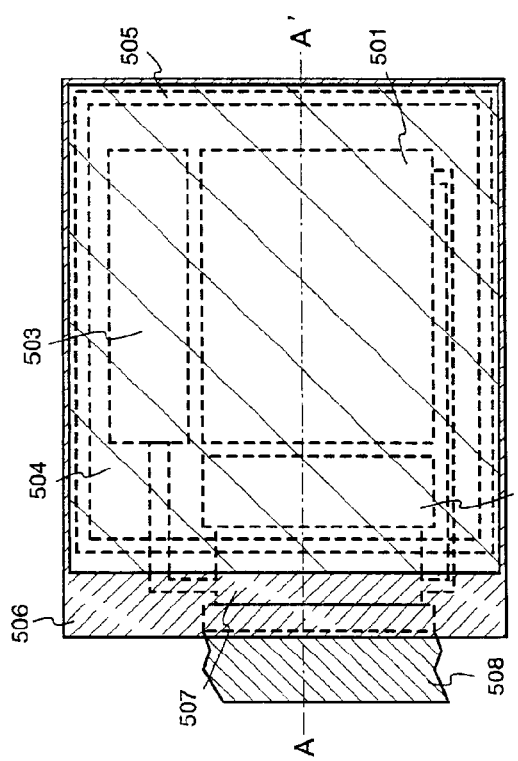
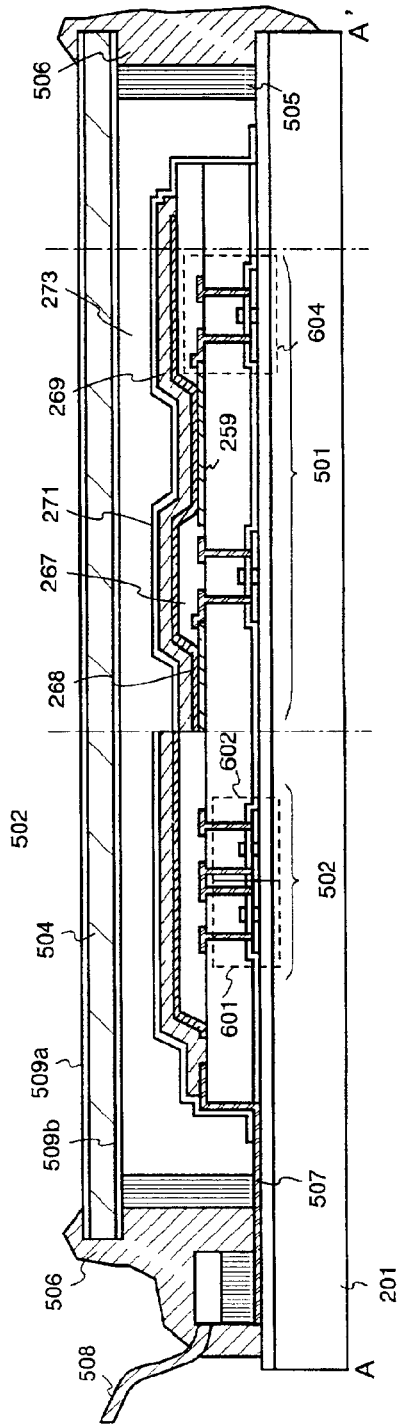
Fig. 5A
Fig. 5B

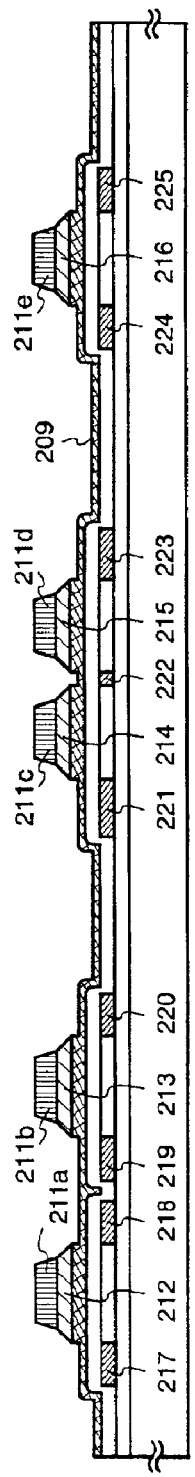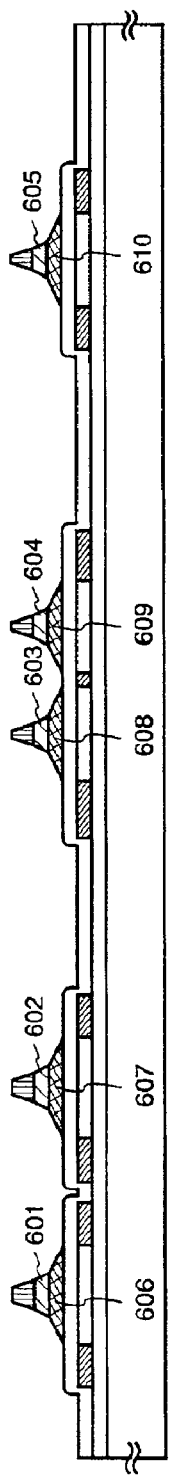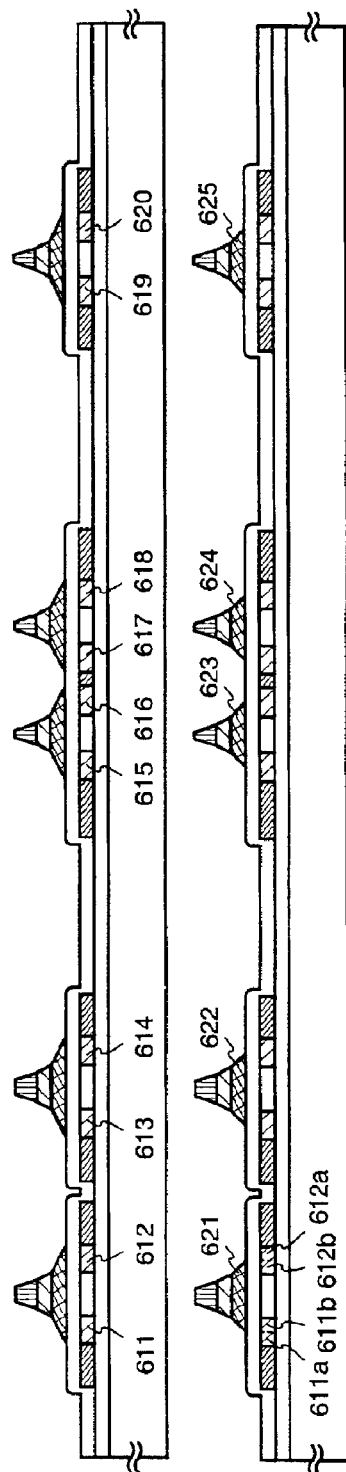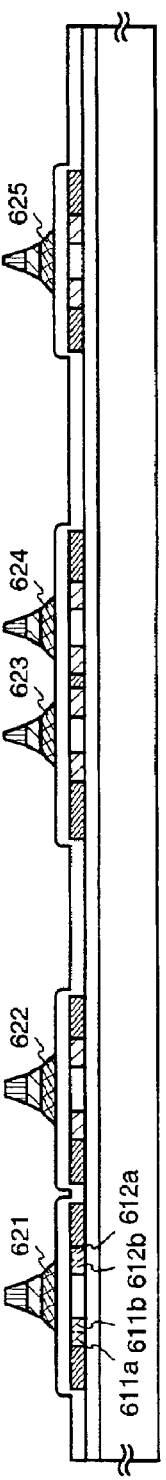

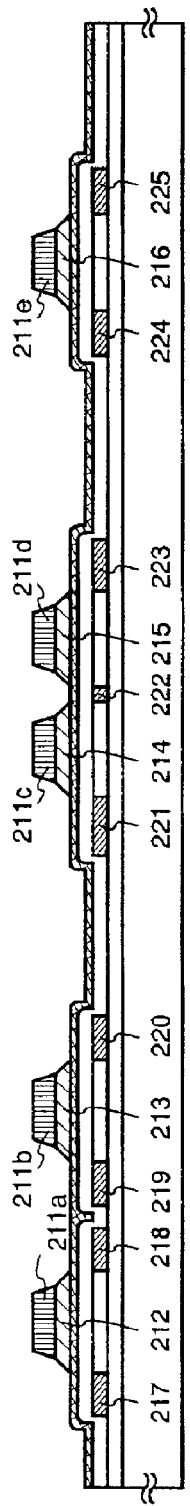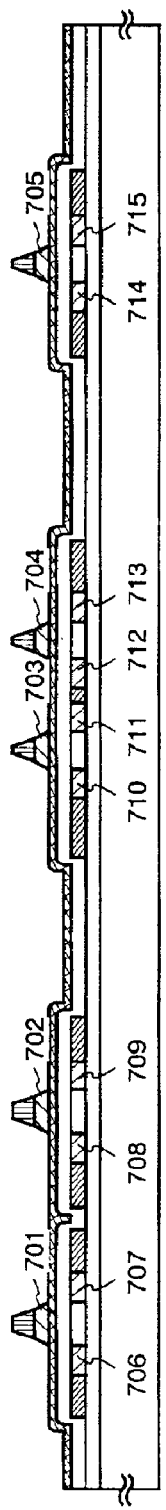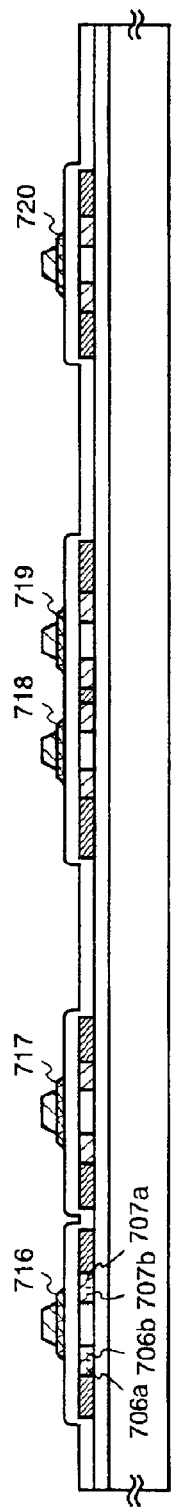

METHOD OF FABRICATING A LIGHT EMITTING DEVICE

BACKGROUND OF THE INVENTION

1. Field of the Invention

The present invention relates to a device (hereinafter referred to as a light emitting device) including an element (hereinafter referred to as a light emitting element) having a luminous material interposed between electrodes. Particularly, the present invention relates to a light emitting device including a light emitting element (hereinafter referred to as an EL element) using, as a luminous material, an organic compound in which EL (Electro Luminescence) is obtained. Incidentally, an organic EL display and an organic light emitting diode (OLED: Organic Light Emitting Diode) are included in the light emitting device of the present invention.

The luminous material which can be used for the present invention includes any luminous materials which emit light (phosphorescence and/or fluorescence) through singlet excitation, triplet excitation, or both excitations.

2. Description of the Related Art

In recent years, research of an EL element has proceeded in which a thin film capable of obtaining EL and made of an organic compound is interposed between an anode and a cathode, and development of a light emitting device using self luminescence of the EL element has proceeded. In the development of this light emitting device, although a passive matrix type has been the mainstream, there is a fear that when a pixel portion becomes highly fine, the light emitting brightness of the EL element must be increased, so that the reliability (the long life of the EL element) can not be secured.

Then, recently, attention has been paid to an active matrix type in order to attain a highly fine display. The active matrix type light emitting device has a feature that an input signal is controlled by a semiconductor element provided in each pixel to make an EL element emit light, and a transistor is generally used as the semiconductor element.

A typical pixel structure is such that two transistors are included in a pixel and have different roles respectively, and the light emitting brightness of the EL element can be controlled. As a result, a light emitting period is almost equivalent to one frame period, and even if a pixel portion becomes highly fine, it becomes possible to display an image while the light emitting brightness is suppressed. Thus, it has been considered that the active matrix type is effective for a light emitting device including a highly fine pixel portion.

However, in the active matrix type light emitting device, a plurality of transistors are formed on the same substrate, and it is difficult to ensure the yield as compared with a passive matrix type of a simple structure. Besides, since a manufacturing process of a transistor is relatively complicated, there is a fear that the manufacturing cost becomes high as compared with the passive matrix type light emitting device. Further, in that case, there is a fear that the unit cost of an electric instrument using the active matrix type light emitting device as its display portion is also raised.

SUMMARY OF THE INVENTION

The present invention has an object to provide a technique for fabricating an active matrix type light emitting device having a low manufacturing cost. This object is especially pursued in the light emitting device having a number of photolithography steps as compared with an active matrix type liquid crystal display device.

Further, the present invention has another object to decrease the manufacturing cost of an electric instrument using the active matrix type light emitting device as a display portion.

According to the present invention, photolithography steps relating to manufacture of a transistor are reduced, so that the yield of a light emitting device is improved, the manufacturing period is shortened, and the manufacturing cost is reduced. The feature is that a gate electrode is formed of a plurality of conductive films, and the selection ratio of those at the time of etching is used to make a highly reliable structure. Incidentally, in the present specification, a transistor includes a MOS transistor and a thin film transistor.

BRIEF DESCRIPTION OF THE DRAWINGS

FIGS. 2A to 2E are views showing manufacturing steps of a light emitting device.

FIGS. 4A and 4B are views showing manufacturing steps of the light emitting device.

FIGS. 5A and 5B are views showing an upper structure and a cross sectional structure of a light emitting device.

FIGS. 6A to 6D are views showing manufacturing steps of a light emitting device.

FIGS. 7A to 7C are views showing manufacturing steps of a light emitting device.

DETAILED DESCRIPTION OF THE PREFERRED EMBODIMENTS

Figure 1A:
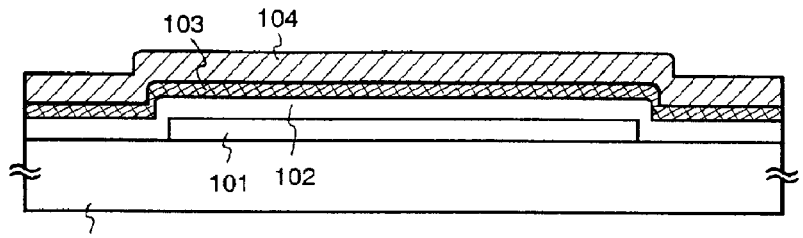
FIGS. 1A to 1F are views showing manufacturing steps of an n-channel transistor.

An example of fabricating steps of an n-channel transistor characterizing the present invention will be described with reference to FIGS. 1A to 1F. In FIG. 1A, reference numeral 100 designates an insulator which is a substrate provided with an insulating film on its surface, an insulating substrate, or an insulating film. A semiconductor film (typically, a silicon film) 101 is formed on the insulator 100, and this semiconductor film 101 becomes an active layer of a transistor. The semiconductor film 101 is covered with an insulating film 102 containing silicon, and this insulating film 102 becomes a gate insulating film of the transistor. As the insulating film containing silicon, it is possible to use a silicon oxide film, a silicon nitride film, a silicon nitride oxide film, or a laminate film of a combination of these.

Next, a conductive film in which at least two conductive films are laminated, is formed on the insulating film 102 containing silicon. Here, a first conductive film 103 and a second conductive film 104 are formed. Here, it is preferable to make such a combination that the selection ratio at the time of etching can be secured between the first conductive film 103 and the second conductive film 104.

As a typical example of such a combination, it is possible to enumerate 1) combination of a tantalum nitride film as the first conductive film and a tungsten film as the second conductive film, 2) combination of a tungsten film as the first conductive film and an aluminum alloy film as the second conductive film, and 3) combination of a titanium nitride film as the first conductive film and a tungsten film as the second conductive film.

In the combination 1), the tungsten film and the tantalum nitride film are etched by a combination of chlorine ($Cl_2$) gas and a carbon tetrafluoride ($CF_4$) gas, and an etching rate of the tantalum nitride film is extremely lowered by adding an oxygen ($O_2$) gas to this gas system, so that the selection ratio can be secured.

In the combination 2), although the aluminum film is etched by a combination of a bromine trichloride ($BCl_3$) gas and a chlorine ($Cl_2$) gas, the tungsten film is not etched. Besides, although the tungsten film is etched by a combination of a chlorine ($Cl_2$) gas and a carbon tetrafluoride ($CF_4$) gas, the aluminum film is not etched. In this way, the selection ratio of both can be secured.

In the case where the aluminum alloy film is used as the second conductive film, it is preferable to provide a titanium film or a titanium nitride film as a third conductive film thereon. By doing so, contact resistance to another wiring line can be lowered, and further, there is also obtained such a merit that hillocks generated in aluminum alloy can be suppressed.

Figure 1B:
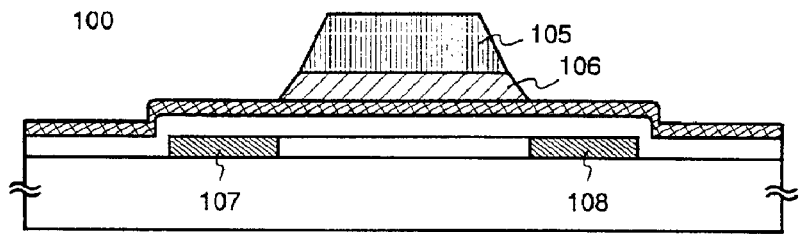

Next, as shown in FIG. 1B, the second conductive film 104 is etched by using a resist 105, and an electrode 106 made of the second conductive film is formed. As an etching condition, it is preferable to perform a dry etching using ICP (Inductively Coupled Plasma). As an etching gas, a mixture gas of a carbon tetrafluoride ($CF_4$) gas, a chlorine ($Cl_2$) gas and an oxygen ($O_2$) gas is used.

As a typical etching condition, a gas pressure is made 1 Pa, and in this state, RF electric power (13.56 MHz) of 500 W is applied to a coil type electrode to produce plasma. Besides, RF electric power (13.56 MHz) of 150 W is applied as a self bias voltage to a stage on which the substrate is put, so that a negative self bias is applied to the substrate. At this time, it is appropriate that the amount of the flow of the respective gases is made such that the carbon tetrafluoride gas has a flow of $2.5 \times 10^{-5}$ m$^3$/min, the chlorine gas has a flow of $2.5 \times 10^{-5}$ m$^3$/min, and the oxygen gas has a flow of $1.0 \times 10^{-5}$ m$^3$/min. The etching rate of the tantalum nitride film is suppressed by the existence of oxygen.

In this state, an impurity element (hereinafter referred to as an n-type impurity element) for making a semiconductor an n-type semiconductor is added to the semiconductor film 101. At this time, since the gate insulating film 102 is covered with the first conductive film 103, the electrode 106 made of the second conductive film is used as a mask, and the n-type impurity element is made to pass through the first conductive film 103 and is added. That is, the n-type impurity element is added to the semiconductor film 101 by self-alignment using the electrode 106 made of the second conductive film. Specifically, an element (typically, phosphorus or arsenic) belonging to group 15 of the periodic table can be used as the n-type impurity element.

At this time, a well-known plasma doping method or ion implantation method may be used as an adding method. The concentration of the element added in the semiconductor film may be made $1 \times 10^{20}$ to $1 \times 10^{21}$ atoms/cm$^3$. Regions 107 and 108 in which the n-type impurity element of the concentration like this is added are called n-type impurity regions (a) in the present specification.

Figure 1C:
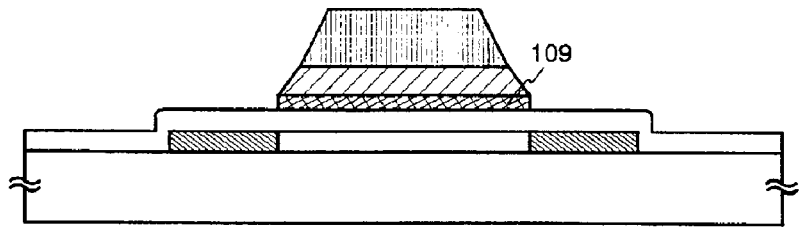

Next, as shown in FIG. 1C, the first conductive film 103 is etched by self-alignment using the electrode 106 made of the second conductive film as a mask. By this, an electrode 109 made of the first conductive film is formed under the electrode 106 made of the second conductive film.

This etching is performed by a dry etching method using the ICP, and a mixture gas of a carbon tetrafluoride ($CF_4$) gas and a chlorine ($Cl_2$) gas is used as an etching gas. A typical etching condition is such that a gas pressure is made 1 Pa, and RF electric power (13.56 MHz) of 500 W is applied to a coil type electrode to produce plasma in this state. Besides, RF electric power (13.56 MHz) of 20 W is applied as a self bias voltage to the stage on which the substrate is put, so that a negative self bias is applied to the substrate. At this time, it is appropriate that the flow of the respective gases is made such that the carbon tetrafluoride gas has a flow of $3.0 \times 10^{-5}$ m$^3$/min, and the chlorine gas has a flow of $3.0 \times 10^{-5}$ m$^3$/min.

Figure 1D:
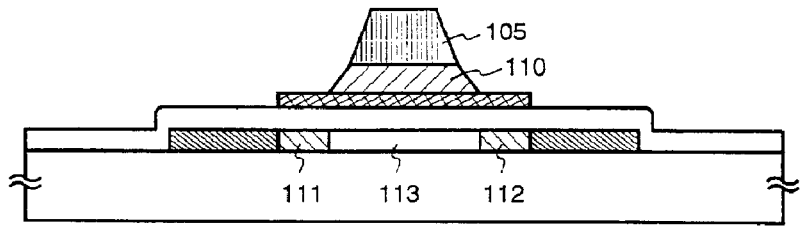

Next, as shown in FIG. 1D, the line width of the electrode 106 made of the second conductive film is narrowed by etching, and a second gate electrode 110 is formed. The second gate electrode 110 indicates an electrode made of the second conductive film and functioning as the gate electrode of a transistor.

This etching is performed by a dry etching method using the ICP, and a mixture gas of a carbon tetrafluoride ($CF_4$) gas, a chlorine ($Cl_2$) gas and an oxygen ($O_2$) gas is used as an etching gas. A typical etching condition is such that a gas pressure is made 1 Pa, and in this state, RF electric power (13.56 MHz) of 500 W is applied to a coil type electrode to produce plasma. Besides, RF electric power (13.56 MHz) of 20 W is applied as a self bias voltage to the stage on which the substrate is put, so that a negative self bias is applied to the substrate. At this time, it is appropriate that the amount of the flow of the respective gases is made such that the carbon tetrafluoride gas has a flow of $2.5 \times 10^{-5}$ m$^3$/min, the chlorine gas has a flow of $2.5 \times 10^{-5}$ m$^3$/min, and the oxygen gas has a flow of $1.0 \times 10^{-5}$ m$^3$/min. The etching rate of the tantalum nitride film is suppressed by the existence of oxygen.

Next, an adding step of the n-type impurity element is again carried out. At this time, in regions designated by reference numerals 111 and 112, regions are formed in which the n-type impurity element having a concentration of $1 \times 10^{17}$ to $1 \times 10^{19}$ atoms/cm$^3$ is added. The regions 111 and 112 in which the n-type impurity element of the concentration like this is added, are called n-type impurity regions (b) in the present specification.

In this adding step, a portion where the conductive films of at least two layers are laminated, that is, a laminate portion of the electrode 109 made of the first conductive film and the second gate electrode 110 becomes a mask, and the n-type impurity element is made to pass through a portion where only the electrode 109 made of the first conductive film is exposed and is added. That is, the n-type impurity element is added to the semiconductor film 101 by self-alignment using the second gate electrode 110.

A region 113 where the n-type impurity element is not added is a region functioning as a channel formation region of the transistor, and is formed just under the second gate electrode 110.

Figure 1E:
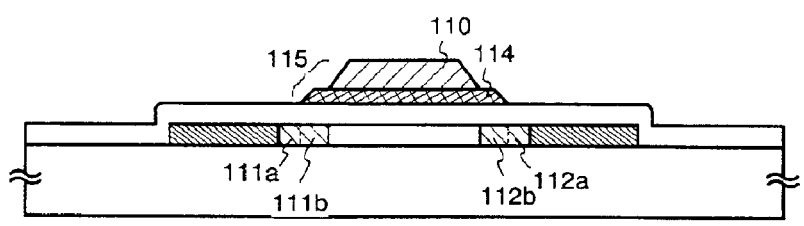

Next, as shown in FIG. 1E, the line width of the electrode 109 made of the first conductive film is narrowed by etching, and a first gate electrode 114 is formed. Note that, the first gate electrode 114 indicates an electrode made of the first conductive film and functioning as the gate electrode of a transistor.

This etching is performed by a dry etching method using the ICP or a dry etching method with an RIE (Reactive Ion Etching) mode, and a mixture gas of a carbon tetrafluoride ($CF_4$) gas and a chlorine ($Cl_2$) gas is used as an etching gas. A typical etching condition is such that a gas pressure is made 1 Pa, and RF electric power (13.56 MHz) of 500 W is applied to a coil type electrode to produce plasma in this state. Besides, RF electric power (13.56 MHz) of 20 W is applied as a self bias voltage to the stage on which the substrate is put, so that a negative self bias is applied to the substrate. At this time, it is appropriate that the amount of the flow of the respective gases is made such that the carbon tetrafluoride gas has a flow of $2.5 \times 10^{-5}$ $m^3$/min, the chlorine gas has a flow of $2.5 \times 10^{-5}$ $m^3$/min, and the oxygen gas has a flow of $1.0 \times 10^{-5}$ $m^3$/min.

Note that, although this etching step has an object to etch the electrode 109 made of the first conductive film (tantalum nitride film), the etching rate of the tantalum nitride film is suppressed by adding the oxygen gas. This is for achieving fine adjustment of the etching amount of the electrode 109 made of the first conductive film.

At this time, a feature is that etching is stopped at a place where an end portion of the first gate electrode 114 overlaps a part of each of the n-type impurity regions (b) 111 and 112 through the gate insulating film 102. That is, the n-type impurity region (b) 111 is divided into a region 111a not overlapping the first gate electrode 114 and a region 111b overlapping there through the gate insulating film 102. The n-type impurity region (b) 112 is also divided into a region 112a not overlapping the first gate electrode 114 and a region 112b overlapping there through the gate insulating film 102.

Figure 1F:
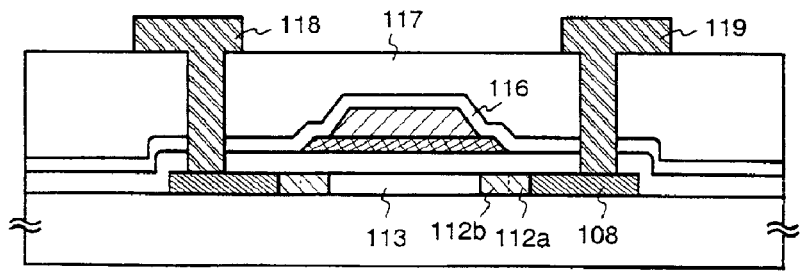

Thereafter, as shown in FIG. 1F, when a passivation film 116, an interlayer insulating film 117, a source wiring line 118 being in contact with the semiconductor film which becomes the active layer of the transistor, and a drain wiring line 119 are formed, the n-channel transistor is completed. As the passivation film 116, a silicon nitride film or a silicon nitride oxide film may be used. As the interlayer insulating film 117, an inorganic insulating film, an organic insulating film, or a laminate film of those may be used. As the organic insulating film, a resin film of polyimide, acryl resin, polyamide, or BCB (benzocyclobutene) may be used. Besides, a well-known conductive film may be used as the source wiring line 118 and the drain wiring line 119.

In the above fabricating steps, photolithography steps are carried out for four times, that is, at the time of formation of the semiconductor film 101, at the time of formation of the electrode 106 made of the second conductive film, at the time of formation of contact holes of the interlayer insulating film 117, and at the time of formation of the source wiring line 118 and the drain wiring line 119. In the case where a CMOS circuit is formed, although the photolithography steps are increased by one in order to fabricate a p-channel transistor, the steps are carried out only for five times nevertheless.

In the transistor of FIG. 1F, the n-type impurity region (b) 112 is formed between the channel formation region 113 and the drain region 108. Here, in the n-type impurity region (b) 112, the region designated by reference numeral 112b overlaps the first gate electrode 114 through the gate insulating film 102, and this structure is very effective to prevent hot carrier deterioration. Besides, in the n-type impurity region (b) 112, the region designated by the reference numeral 112a is a region having the same function as a conventional LDD (Lightly Doped Drain) region.

Accordingly, in the transistor of FIG. 1F, a hot carrier countermeasure is taken by the region 111b or 112b, and a leak current countermeasure is taken by the region 111a or 112a, so that a highly reliable structure is made. Like this, since the highly reliable transistor can be fabricated through the five photolithography steps, not only the improvement of the yield of the light emitting device including the light emitting element and the shortening of the manufacturing period are realized, but also the inexpensive and highly reliable light emitting device can be fabricated.

Hereinafter, embodiment mode of the present invention will be described in detail using the embodiments described below.

Embodiment 1

In this embodiment, a description will be given of a method of manufacturing a pixel portion and a driving circuit provided at its periphery on the same insulator. However, for simplification of the description, with respect to the driving circuit, a CMOS circuit in which an n-channel transistor and a p-channel transistor are combined will be shown.

First, as shown in FIG. 2A, a glass substrate 201 is prepared. In this embodiment, not-shown protection films (carbon films, specifically diamond-like carbon films) are provided on both surfaces (the front surface and the rear surface) of the glass substrate 201. As long as it is transparent to visible light, a material other than glass (for example, plastic) may be used.

Next, an under film 202 having a thickness of 300 nm is formed on the glass substrate 201. In this embodiment, as the under film 202, silicon nitride oxide films are laminated and are used. At this time, it is appropriate that the concentration of nitrogen of a layer adjacent to the glass substrate 201 is made 10 to 25 wt %, and nitrogen is made to be contained at the concentration rather higher than that of another layer.

Next, an amorphous silicon film (not shown) having a thickness of 50 nm is formed on the under film 202 by a sputtering method. Note that, it is not necessary to limit the film to the amorphous silicon film, but any semiconductor films (including a microcrystalline semiconductor film) containing amorphous structure may be used. As the amorphous semiconductor film, an amorphous silicon film or an amorphous silicon germanium film (a silicon film containing germanium at a concentration of $1 \times 10^{18}$ to $1 \times 10^{21}$ atoms/$cm^3$) may be used. The film thickness may be 20 to 100 nm.

Then, crystallization of the amorphous silicon film is performed by using a well-known laser crystallizing method, and a crystalline silicon film 203 is formed. In this embodiment, although a solid laser (specifically, second harmonic of Nd:YAG laser) is used, an excimer laser may also be used. As the crystallizing method, a furnace annealing method may be used.

Next, as shown in FIG. 2B, the crystalline silicon film 203 is etched by a first photolithography step to form island-like crystalline silicon films 204 to 207. These are crystalline silicon films which subsequently become the active layers of transistors.

Note that, in this embodiment, although the crystalline silicon films are used as the active layers of the transistors, an amorphous silicon film can also be used as the active layer.

Here, in this embodiment, a protection film (not shown) made of a silicon oxide film and having a thickness of 130 nm is formed on the island-like crystalline silicon films 204 to 207 by a sputtering method, and an impurity element (hereinafter referred to as a p-type impurity element) to make a semiconductor a p-type semiconductor is added to the island-like crystalline silicon films 204 to 207. As the p-type impurity element, an element (typically, boron or gallium) belonging to group 13 of the periodic table can be used. Note that, this protection film is provided to prevent the crystalline silicon film from directly being exposed to plasma when the impurity is added, and to enable fine concentration control.

The concentration of the p-type impurity element added at this time may be made $1\times10^{15}$ to $5\times10^{17}$ atoms/cm$^3$ (typically, $1\times10^{16}$ to $1\times10^{17}$ atoms/cm$^3$). The p-type impurity element added at this concentration is used to adjust the threshold voltage of the n-channel transistor.

Next, the surfaces of the island-like crystalline silicon films 204 to 207 are washed. First, the surface is washed by using pure water containing ozone. At that time, since a thin oxide film is formed on the surface, the thin oxide film is removed by using a hydrofluoric acid solution diluted to 1%. By this treatment, contaminants adhered to the surfaces of the island-like crystalline silicon films 204 to 207 can be removed. At this time, it is preferable that the concentration of ozone is 6 mg/L or more. The series of treatments are carried out without opening to the air.

Then, a gate insulating film 208 is formed to cover the island-like crystalline silicon films 204 to 207. As the gate insulating film 208, an insulating film having a thickness of 10 to 150 nm, preferably 50 to 100 nm and containing silicon may be used. This may have a single-layer structure or a laminate structure. In this embodiment, a silicon nitride oxide film having a thickness of 80 nm is used.

In this embodiment, the steps from the surface washing of the island-like crystalline silicon films 204 to 207 to the formation of the gate insulating film 208 are carried out without opening to the air, so that contaminants and interface levels on the interface between the semiconductor film and the gate insulating film are lowered. In this case, a device of a multi-chamber system (or an inline system) including at least a washing chamber and a sputtering chamber may be used.

Next, a tantalum nitride film having a thickness of 30 nm is formed as a first conductive film 209, and further, a tungsten film having a thickness of 370 nm is formed as a second conductive film 210. In addition, a combination of a tungsten film as the first conductive film and an aluminum alloy film as the second conductive film, or a combination of a titanium film as the first conductive film and a tungsten film as the second conductive film may be used.

These metal films may be formed by a sputtering method. When an inert gas such as Xe or Ne is added as a sputtering gas, film peeling due to stress can be prevented. When the purity of a tungsten target is made 99.9999%, a low resistance tungsten film having a resistivity of 20 mΩcm or less can be formed.

Besides, the steps from the surface washing of the semiconductors 204 to 207 to the formation of the second conductive film 210 can also be carried out without opening to the air. In this case, a device of a multi-chamber system (or an inline system) including at least a washing chamber, a sputtering chamber for forming an insulating film, and a sputtering chamber for forming a conductive film may be used.

Next, resists 211a to 211e are formed, and the second conductive film 210 is etched. As an etching condition here, the condition explained in FIG. 1B may be adopted (FIG. 2C).

By this, the second conductive film (tungsten film) 210 is selectively etched, and electrodes 212 to 216 made of the first conductive film are formed. The reason why the second conductive film 210 is selectively etched is that the progress of etching of the first conductive film (tantalum nitride film) becomes extremely slow by addition of oxygen to the etching gas.

Note that, here, there is a reason why the first conductive film 209 is made to remain. Although the first conductive film can also be etched at this time, if the first conductive film is etched, the gate insulating film 208 is also etched in the same step and the film thickness is decreased. At this time, if the thickness of the gate insulating film 208 is 100 nm or more, there is no problem. However, if the thickness is less than that, a part of the gate insulating film 208 is removed in a subsequent step and the semiconductor film thereunder is exposed, and there is a possibility that the semiconductor film which becomes a source region or a drain region of a transistor is also removed.

However, the foregoing problem can be solved by leaving the first conductive film 209 as in this embodiment.

Next, an n-type impurity element (in this embodiment, phosphorus) is added in a self-aligning manner by using the resists 211a to 211e and the electrodes 212 to 216. At this time, phosphorus passes through the first conductive film 209 and is added. Impurity regions 217 to 225 formed in this way contain the n-type impurity element at a concentration of $1\times10^{20}$ to $1\times10^{21}$ atoms/cm$^3$ (typically, $2\times10^{20}$ to $5\times10^{21}$ atoms/cm$^3$).

Next, the first conductive film 209 is etched by using the resists 211a to 211e as masks. As an etching condition here, the condition explained in FIG. 1C may be adopted. In this way, electrodes 226 to 230 made of the first conductive film are formed (FIG. 2D).

Next, as shown in FIG. 2E, the electrodes 212 to 216 made of the second conductive film are selectively etched by using the resists 211a to 211e as they are. As an etching condition here, the condition explained in FIG. 1D may be adopted. In this way, second gate electrodes 231 to 235 are formed.

Next, an n-type impurity element (in this embodiment, phosphorus) is added. In this step, the second gate electrodes 231 to 235 function as masks, and phosphorus passes through part of the electrodes 226 to 230 made of the first conductive film and is added, and n-type impurity regions 236 to 245 containing phosphorus at a concentration of $2\times10^{16}$ to $5\times10^{19}$ atoms/cm$^3$ (typically, $5\times10^{17}$ to $5\times10^{18}$ atoms/cm$^3$) are formed.

Besides, as an addition condition here, an acceleration voltage is set quite high as 70 to 120 kV (in this embodiment, 90 kV) so that phosphorus passes through the first conductive film and the gate insulating film and reaches the island-like crystalline silicon films.

Figure 3A:
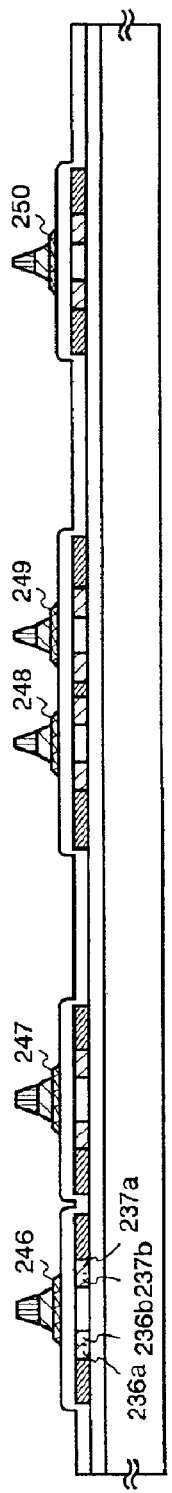
FIGS. 3A to 3D are views showing manufacturing steps of the light emitting device.

Next, as shown in FIG. 3A, the electrodes 226 to 230 made of the first conductive film are etched to form first gate electrodes 246 to 250. As an etching condition here, the condition explained in FIG. 1E may be adopted.

At this time, the first gate electrodes 246 to 250 are etched so that they partially overlap the n-type impurity regions (b) 236 to 245 through the gate insulating film 208. For example, the n-type impurity region (b) 236 is divided into a region 236a not overlapping the first gate electrode 246 and a region 236b overlapping there through the gate insulating film 208. The n-type impurity region (b) 237 is divided into a region 237a not overlapping the first gate electrode 246 and a region 237b overlapping there through the gate insulating film 208.

Figure 3B:
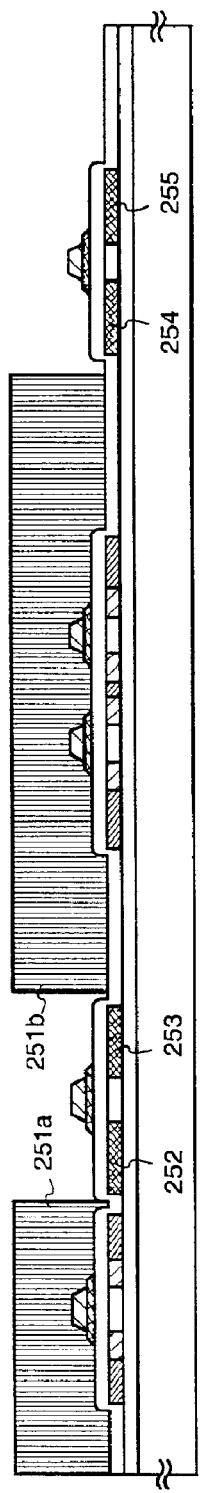

Next, resists 251a and 251b are formed, and an impurity element (hereinafter referred to as a p-type impurity element) to make a semiconductor a p-type semiconductor is added. As the p-type impurity element, an element (typically, boron) belonging to group 13 of the periodic table may be added. Here, an acceleration voltage is set so that boron passes through the first gate electrodes 247 and 250 and the gate insulating film 208, and reaches the semiconductor film. In this way, p-type impurity regions 252 to 255 are formed (FIG. 3B).

Figure 3C:
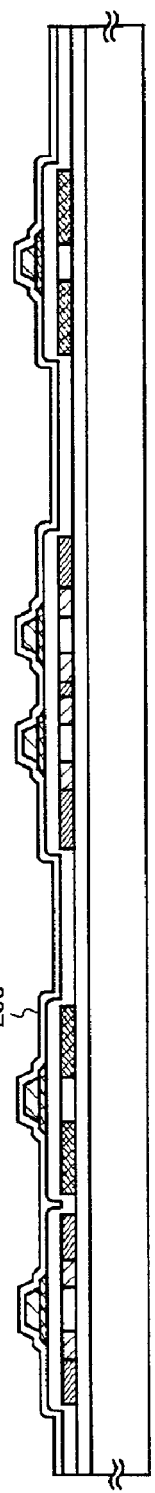

Next, as shown in FIG. 3C, as a first inorganic insulating film 256, a silicon nitride film or silicon nitride oxide film having a thickness of 30 to 100 nm is formed. Thereafter, the added n-type impurity element and p-type impurity element are activated. As an activation means, a furnace annealing, a laser annealing, a lamp annealing, or a combination of those can be used.

Figure 3D:
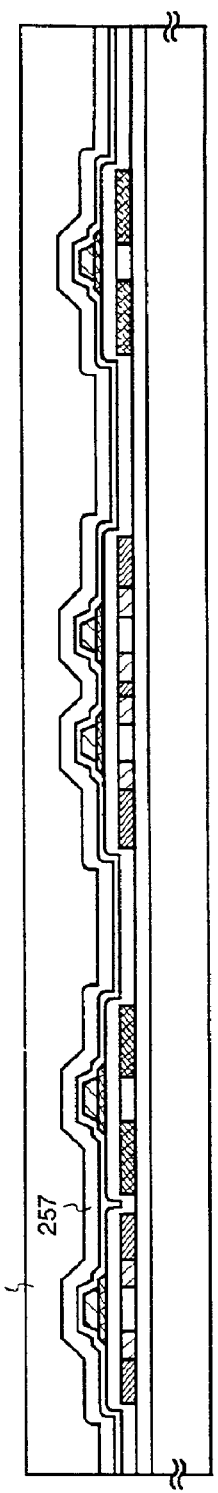

Next, as shown in FIG. 3D, a second inorganic insulating film 257 made of a silicon nitride film or a silicon nitride oxide film is formed to a thickness of 50 to 200 nm. After the second inorganic insulating film 257 is formed, a heat treatment in the temperature range of 350 to 450° C. is carried out. Note that, it is effective to carry out a plasma treatment using a hydrogen ($H_2$) gas or an ammonia ($NH_3$) gas before the second inorganic insulating film 257 is formed.

Next, as an organic insulating film 258, a resin film transparent to visible light is formed to a thickness of 1 to 2 $\mu$m. As the resin film, a polyimide film, a polyamide film, an acryl resin film, or a BCB (benzocyclobutene) film may be used. Besides, a photosensitive resin film can also be used.

Note that, in this embodiment, the laminate film of the first inorganic insulating film 256, the second inorganic insulating film 257, and the organic insulating film 258 is generically called an interlayer insulating film.

Next, as shown in FIG. 4A, a pixel electrode (anode) 259 made of an oxide conductive film which has a large work function and is transparent to visible light is formed to a thickness of 80 to 120 nm on the organic insulating film 258. In this embodiment, an oxide conductive film in which gallium oxide is added to zinc oxide is formed. Besides, as another oxide conductive film, it is also possible to use an oxide conductive film made of indium oxide, zinc oxide, tin oxide, or a compound of combination of those.

Note that, after the oxide conductive film is formed, although patterning is carried out to form the pixel electrode 259, a flattening treatment of the surface of the oxide conductive film can also be carried out before the patterning. The flattening treatment may be a plasma treatment or a CMP (Chemical Mechanical Polishing) treatment. Besides, flattening can also be made by using a treatment of rubbing with a high molecular material (for example, polyvinyl alcohol polymer) or the like.

Next, contact holes are formed in the interlayer insulating film, and wiring lines 260 to 266 are formed. At this time, the wiring line 266 is formed to be connected with the pixel electrode 259. In this embodiment, this wiring line is made as the laminate film of three-layer structure in which a titanium film having a thickness of 150 nm, an aluminum film containing titanium and having a thickness of 300 nm, and a titanium film having a thickness of 100 nm are continuously formed from the lower layer side by a sputtering method.

At this time, the wiring lines 260 and 262 function as source wiring lines of a CMOS circuit, and the wiring line 261 functions as a drain wiring line. The wiring line 263 is a source wiring line of a switching transistor, and the wiring line 264 is a drain wiring line of the switching transistor. The wiring line 265 is a source wiring line (equivalent to a current supply line) of a current control transistor, and the wiring line 266 is a drain wiring line of the current control transistor and is connected with the pixel electrode 259.

Next, as shown in FIG. 4B, an insulating film (hereinafter referred to as a bank) 267 having an opening portion on the pixel electrode is formed. The bank 267 may be formed by patterning an insulating film having a thickness of 100 to 400 nm and containing silicon or an organic resin film. This bank 267 is formed to fill a portion between a pixel and a pixel (between a pixel electrode and a pixel electrode). Besides, it also has an object to prevent a subsequently formed organic EL film such as a light emitting layer from being brought into direct contact with the end portion of the pixel electrode 259.

Incidentally, since the bank 267 is an insulating film, attention must be paid to electrostatic damage of a device at the time of film formation. When carbon particles or metal particles are added into the insulating film, which becomes a material of the bank, to lower its resistivity, the generation of static electricity at the time of film formation can be suppressed. In that case, it is appropriate that the amount of addition of carbon particles or metal particles is adjusted so that the resistivity of the insulating film, which becomes a material of the bank 267, becomes $1\times10^6$ to $1\times10^{12}$ $\Omega$m (preferably, $1\times10^8$ to $1\times10^{10}$ $\Omega$m).

When the carbon particles or the metal particles are added to the bank 267, optical absorption is raised and transmissivity is lowered. That is, since light from the outside of the light emitting device is absorbed, it is possible to avoid such a disadvantage that an outside scene is reflected in the cathode surface of the EL element.

Next, an EL layer 268 is formed by an evaporation method. Incidentally, in this embodiment, a laminate layer of a hole injecting layer and a light emitting layer is called an EL layer. That is, a laminate layer of a combination of a hole injecting layer, a hole transporting layer, a hole blocking layer, an electron transporting layer, an electron injecting layer, or an electron blocking layer and a light emitting layer is defined as the EL layer. In this embodiment, it is possible to use a well-known light emitting layer, hole injecting layer, hole transporting layer, hole blocking layer, electron transporting layer, electron injecting layer, or electron blocking layer.

In this embodiment, first, as the hole injecting layer, a copper phthalocyanine (CuPc) film is formed to a thickness of 20 nm, and further, aluminum quinolinolato complex (Alq$_3$) is formed to a thickness of 80 nm as the light emitting layer. Besides, a dopant (typically, fluorescent pigment) which becomes a light emitting center may be added to the light emitting layer by codeposition.

Next, after the EL layer 268 is formed, a cathode 269 made of a conductive film which has a small work function is formed to a thickness of 300 nm. As the conductive film having the small work function, a conductive film containing an element belonging to group 1 or group 2 of the periodic table may be used. In this embodiment, a conductive film made of a compound of lithium and aluminum is used.

In this way, an EL element 270 including the pixel electrode (anode) 259, the EL layer 268, and the cathode 269 is formed.

Note that, it is effective to provide a passivation film 271 to completely cover the EL element 270 after the cathode 269 is formed. As the passivation film 271, a single layer of an insulating film including a carbon film, a silicon nitride film, or a silicon nitride oxide film, or a laminate layer of a combination of the insulating films is used.

At this time, it is preferable to use a film having an excellent coverage as the passivation film, and it is effective to use a carbon film, especially a DLC (Diamond-Like Carbon) film. Since the DLC film can be formed in the temperature range of from room temperature to 100 C or less, it can also be formed easily over the EL layer 268 having low heat resistance. Besides, the DLC film has a high blocking effect to oxygen, and can suppress oxidation of the EL layer 268. Thus, it is possible to prevent such a problem that the EL layer 268 is oxidized during a subsequently performed sealing step.

Further, a seal member (not shown) is provided on the substrate 201 (or the under film 202) so as to surround at least the pixel portion, and a cover member 272 is bonded. As the seal member 569, an ultraviolet ray curing resin which has little degassing and resistance to the permeation of water and oxygen may be used. A space 273 may be filled with an inert gas (nitrogen gas or rare gas), a resin (ultraviolet ray curing resin or epoxy resin) or an inert liquid.

Besides, it is effective to provide a material having a moisture absorption effect or a material having an oxidation preventing effect in the space 273. As the cover member 272, a glass substrate, a metal substrate (preferably a stainless substrate), a ceramic substrate or a plastic substrate (including a plastic film) may be used. In the case where the plastic substrate is used, it is preferable to provide a carbon film (preferably a diamond-like carbon film) on the front surface and the rear surface to prevent the permeation of oxygen and water.

In this way, the light emitting device as shown in FIG. 4B is completed. Note that, it is effective that after the bank 267 is formed, the steps up to the formation of the passivation film 271 are continuously performed by using a film formation device of a multi-chamber system (or an inline system) without opening to the air. By further developing it, it is also possible to continuously perform the steps up to the bonding of the cover member 272 without opening to the air.

In this way, an n-channel transistor 601, a p-channel transistor 602, a switching transistor (a transistor functioning as a switching element for transmitting an image data signal into a pixel) 603, and a current control transistor (a transistor functioning as a current control element for controlling electric current flowing to the EL element) 604 are formed on the glass substrate 201.

At this time, the driving circuit includes, as a basic circuit, the CMOS circuit in which the n-channel transistor 601 and the p-channel transistor 602 are complementarily combined. The pixel portion is formed of a plurality of pixels including the switching transistor 603 and the current control transistor 604.

The numbers of photolithography steps needed in the manufacturing steps up to this point is seven times, and they are smaller than that of a general active matrix type light emitting device. That is, the manufacturing steps of a transistor are greatly simplified, and the improvement of yield and the reduction of manufacturing cost can be realized.

Further, as described by the use of FIG. 3A, by providing the impurity region overlapping the first gate electrode through the gate insulating film, it is possible to form the n-channel transistor having high resistance to deterioration due to the hot carrier effect. Thus, the light emitting device having high reliability can be realized.

Further, the light emitting device of the embodiment after the seal (or encapsulation) step for protecting the EL element is performed will be described with reference to FIGS. 5A and 5B. Note that, reference numerals used in FIGS. 2 to 4 are cited as needed.

FIG. 5A is a top view showing a state where steps up to sealing of an EL element are performed, and FIG. 5B is a cross sectional view of FIG. 5A taken along with the line A–A'. Reference numeral 501 of a portion shown by a dotted line designates a pixel portion; 502, a source side driving circuit; and 503, a gate side driving circuit. Reference numeral 504 designates a cover member; 505, a first seal member; and 506, a second seal member.

Note that, reference numeral 507 designates a wiring line for transmitting signals inputted to the source side driving circuit 502 and the gate side driving circuit 503, which receives a video signal and a clock signal from an FPC (Flexible Print Circuit) 508 as an external input terminal. Note that, although only the FPC is shown here, a print wiring board (PWB) may be attached to the FPC.

Next, a cross sectional structure will be described with reference to FIG. 5B. A pixel portion 501 and a source side driving circuit 502 are formed on a glass substrate 201, and the pixel portion 501 is formed of a plurality of pixels including a current controlling transistor 604 and a pixel electrode 259 electrically connected to its drain. The source side driving circuit 502 is formed by using a CMOS circuit (see FIG. 4B) in which an n-channel transistor 601 and a p-channel transistor 602 are combined. Note that, a polarizing plate (typically, a circular polarizing plate) may be bonded to the glass substrate 201.

The pixel electrode 259 functions as an anode of the EL element. Banks 267 are formed at both ends of the pixel electrode 259, and an EL layer 268 and a cathode 269 of the EL element are formed on the pixel electrode 259. The cathode 269 functions also as a wiring line common to all pixels, and is electrically connected to the FPC 508 through the connection wiring line 507. Further, all elements included in the pixel portion 501 and the source side driving circuit 502 are covered with a passivation film 271.

A cover member 504 is bonded with a first seal member 505. A spacer may be provided to secure an interval between the cover member 504 and the EL element. A space 273 is formed inside of the first seal member 505. It is desirable that the first seal member 505 is a material which water or oxygen does not permeate. Further, it is effective to provide a material having a moisture absorption effect or a material having an oxidation preventing effect in the inside of the space 273.

Note that, it is appropriate that carbon films (specifically, diamond-like carbon films) 509*a* and 509*b* as protection films are formed to a thickness of 2 to 30 nm on the front surface and the rear surface of the cover member 504. The carbon film like this has a role to prevent the infiltration of oxygen and water and to mechanically protect the surface of the cover member 504.

Besides, after the cover member 504 is adhered, a second seal member 506 is provided so as to cover the exposed surface of the first seal member 505. The second seal member 506 can be made of the same material as the first seal member 505.

By encapsulating the EL element in the structure as described above, the EL element can be completely cut off from the outside, and it is possible to prevent a material accelerating deterioration due to oxidation of the EL layer such as moisture or oxygen, from infiltrating from the outside. Accordingly, the light emitting device having high reliability can be obtained.

Note that, as shown in FIGS. 5A and 5B, the light emitting device in which the pixel portion and the driving circuit are provided on the same substrate and the FPC is attached, is especially called a driving circuit built-in light emitting device in the present specification.

The light emitting device fabricated by carrying out this embodiment can be operated by both a digital signal and an analog signal.

Embodiment 2

In this embodiment, an example in which an active matrix type light emitting device is fabricated by a fabricating process different from the embodiment 1 will be described. FIGS. 6A to 6D are used for the description.

First, in accordance with the fabricating process of the embodiment 1, steps up to FIG. 2C are performed. The state is shown in FIG. 6A. In this embodiment, a selection ratio of a first conductive film 209 and a second conductive film 210 is made smaller than the embodiment 1, and the second conductive film 210 is etched. In this case, in the etching step of FIG. 2C, it is appropriate that the flow of an oxygen gas is made $5.0 \times 10^{-6}$ to $8.0 \times 10^{-6}$ m$^3$/min.

By doing so, in the first conductive film 209, portions which are not concealed by electrodes 212 to 216 made of the second conductive film are slightly etched and the film thickness is decreased. In this embodiment, an n-type impurity element (in this embodiment, phosphorus) is added in this state, and n-type impurity regions (a) 217 to 225 are formed. An addition condition may follow the step of FIG. 2C.

Next, in accordance with the etching condition of FIG. 2E of the embodiment 1, the electrodes 212 to 216 made of the second conductive film are etched, and second gate electrodes 601 to 605 are formed. At this step, in the first conductive film 209, the portions in which the film thickness has been decreased at the step of FIG. 6A are removed and disappeared, and electrodes 606 to 610 made of the first conductive film remain (FIG. 6B).

Next, in this state, the n-type impurity element is again added under the same condition as FIG. 2E, and n-type impurity regions (b) 611 to 620 are formed (FIG. 6C).

Next, under the same etching condition as FIG. 3A, the electrodes 606 to 610 made of the first conductive film are etched, and first gate electrodes 621 to 625 are formed. At this time, the n-type impurity region (b) 611 is divided into a region 611*a* not overlapping the first gate electrode 621 and a region 611*b* overlapping there through the gate insulating film. The n-type impurity region (b) 612 is divided into a region 612*a* not overlapping the first gate electrode 621 and a region 612*b* overlapping there through the gate insulating film (FIG. 6D).

When subsequent steps are performed in accordance with the steps subsequent to FIG. 3B, the active matrix type light emitting device shown in FIG. 4B is completed. According to this embodiment, since the decrease of the film thickness of the gate insulating film can be suppressed, it is effective in the case where the thickness of the gate insulating film becomes as thin as 50 to 100 nm. Note that, this embodiment is such that the part of the fabricating steps of the embodiment 1 is changed, and the structure of the embodiment 1 can be cited for the structure other than the one described in this embodiment.

Embodiment 3

In this embodiment, an example in which an active matrix type light emitting device is fabricated by a fabricating process different from the embodiment 1 will be described. FIGS. 7A to 7C are used for the description.

First, in accordance with the fabricating steps of the embodiment 1, steps up to FIG. 2C are performed. The state is shown in FIG. 7A. Next, in accordance with the etching condition of FIG. 2E of the embodiment 1, electrodes 212 to 216 made of a second conductive film are etched, and second gate electrodes 701 to 705 are formed (FIG. 7B).

Next, in this state, an n-type impurity element is again added under the same condition as FIG. 2E, and n-type impurity regions (b) 706 to 715 are formed.

Next, under the same etching condition as FIG. 3A, the first conductive film 209 is etched, and first gate electrodes 716 to 720 are formed. At this time, the n-type impurity region (b) 706 is divided into a region 706*a* not overlapping the first gate electrode 716 and a region 706*b* overlapping there through the gate insulating film. The n-type impurity region (b) 707 is divided into a region 707*a* not overlapping the first gate electrode 716 and a region 707*b* overlapping there through the gate insulating film (FIG. 7C).

When subsequent steps are performed in accordance with the steps subsequent to FIG. 3B, the active matrix type light emitting device shown in FIG. 4B is completed. According to this embodiment, since the decrease of the film thickness of the gate insulating film can be suppressed to the utmost, it is effective in the case where the thickness of the gate insulating film becomes as thin as 50 to 100 nm. Note that, this embodiment is such that the part of the fabricating steps of the embodiment 1 is changed, and the structure of the embodiment 1 can be cited for the structure other than the one described in this embodiment.

Embodiment 4

Figure 8A:
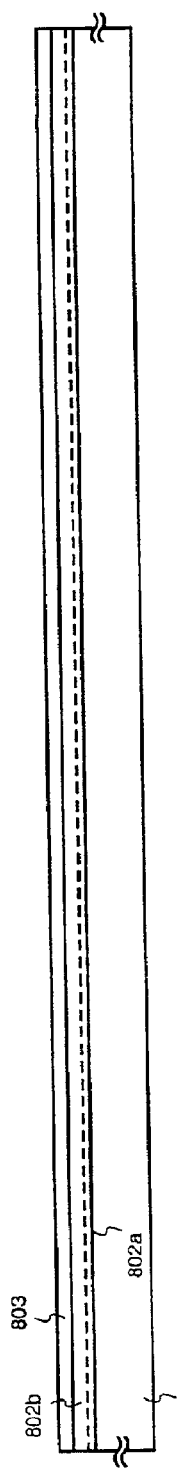
FIGS. 8A to 8E are views showing manufacturing steps of a light emitting device.
Figure 8B:
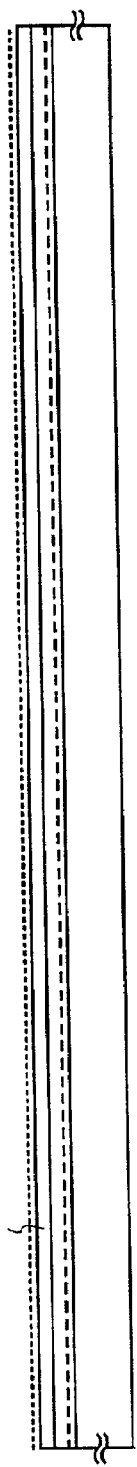
Figure 8C:
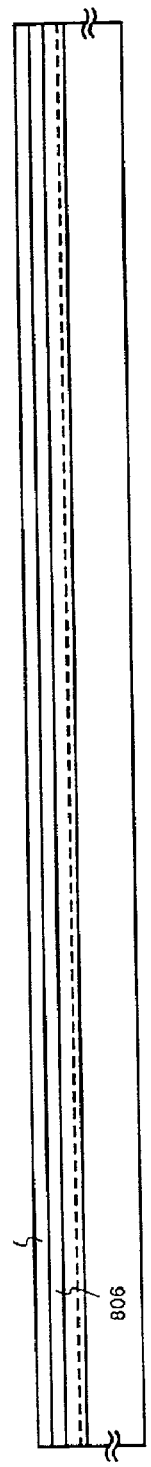
Figure 8D:
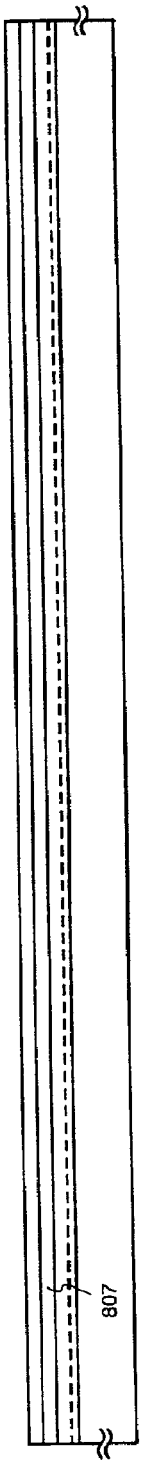
Figure 8E:
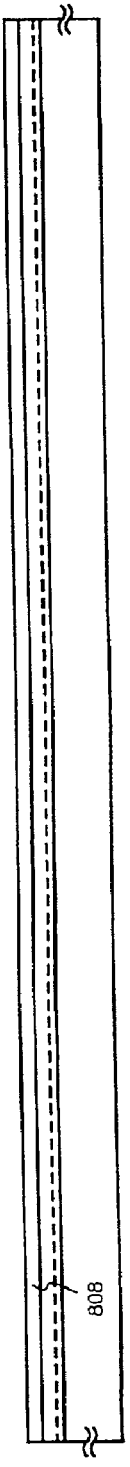
Figure 9:
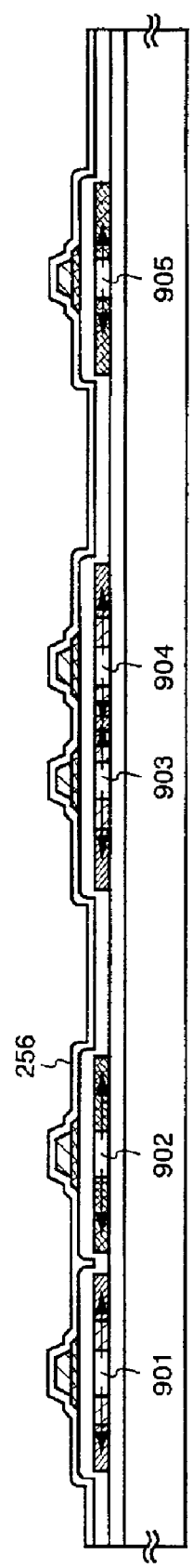
FIG. 9 is a view showing a manufacturing step of a light emitting device.

In this embodiment, an example of a manufacturing method of a crystalline semiconductor film different to that in Embodiment 1 is described. FIGS. 8 and 9 are referred to in the description.

First, a glass substrate 801 is prepared, and a first silicon nitride oxide film 802*a* with a thickness of 100 nm, a second silicon nitride oxide film 802*b* with a thickness of 200 nm, and an amorphous silicon film 803 with a thickness of 50 nm are formed thereon. At this time, it is preferable that the concentration of nitrogen contained in the first silicon nitride film 802*a* is made higher than the concentration of nitrogen contained in the second silicon nitride film 802*b* (FIG. 8A).

Next, nickel (Ni) is added by plasma processing to the amorphous silicon film 803. In the method of adding the nickel, a nickel electrode is used to form plasma of nitrogen gas, ammonia gas, hydrogen gas or noble gas. Note that, in place of nickel, palladium, cobalt, platinum, copper, iridium, Or germanium may be used. In this way an amorphous silicon film 804 added with nickel is obtained (FIG. 8B).

Next, as a protecting film 805, a silicon oxide film with a thickness of 50 to 150 nm is formed. Thereafter, dehydrogenation is conducted in the amorphous silicon film 804 by furnace annealing at 400 to 500° C., and then crystallization of the amorphous silicon film 804 by furnace annealing at 550 to 650° C. is performed. With this crystallization process, the crystalline silicon film 806 is formed (FIG. 8C).

Note that, in this embodiment, the series of processes of forming the first silicon nitride film 802*a*, forming the second silicon nitride film 802*b*, forming the amorphous silicon film 803, plasma processing of nickel, and forming of the protecting film 805 are continuously performed in the same device. For the processes, a device with a multi chamber method having the respective film formation chambers and a plasma processing chamber (a cluster tool method) may be used.

Next, a p-type impurity element (in this embodiment, boron) may be added into the crystalline silicon film 806 from above the protecting film 805. The concentration of boron added at this time may be $1 \times 10^{15}$ to $1 \times 10^{18}$ atoms/cm$^3$. In this way a crystalline silicon film 807 added with boron at a concentration of $1 \times 10^{15}$ to $1 \times 10^{18}$ atoms/cm$^3$ is obtained. Boron added here is an impurity element for adjusting the threshold voltage of the transistor.

Further, by providing the protecting film 805, a fine adjustment of concentration may be performed. Note that, in this embodiment, an example of adding boron to the entire crystalline silicon film 806 is shown, but boron may be added partially by using a mask. Further, an n-type impurity element may be added, or an n-type impurity element and a p-type impurity element may be added.

Next, a protecting film 805 is removed and laser annealing is performed for the exposed crystalline silicon film 807. As a laser, a solid-state laser (typically, an Nd:YAG laser) or an excimer laser may be used. By this laser annealing, a crystalline silicon film 808 with improved crystallinity may be obtained.

Note that, the order of the crystallization process by furnace annealing, the doping process of a p-type impurity element and the laser annealing process may be switched. For example, the doping process of the p-type impurity element may be conducted before the crystallization process by furnace annealing, or after a laser annealing process.

After a crystalline silicon film 808 is obtained as described above, an active matrix type light emitting device is manufactured according to the processes after FIG. 2B of Embodiment 1. However, when implementing this embodiment, metal elements such as nickel, palladium, cobalt, platinum, copper, and iridium are contained in the crystalline silicon film which is to be an active layer. Such a metal element may become a silicide and may become a path of current that leaks, so it is preferably removed as much as possible.

Then, in this embodiment nickel in the crystalline silicon film is reduced by gettering nickel with phosphorus. For that reason, the temperature of the activation process shown in FIG. 3C is set quite high at 500 to 600° C. FIG. 9 shows the above description.

When the activation process is performed in the temperature range of 500 to 600° C., simultaneously nickel moves in the direction of the arrow in FIG. 9, to thereby be captured (gettered) in the region doped with phosphorus. Therefore, the concentration of nickel in the region shown by reference numerals 901 to 905 (the channel forming region of transistors) is reduced to $1 \times 10^{17}$ atoms/cm$^3$ or less in measurement of SIMS (secondary ion mass spectrometer).

The transistor manufactured according to the structure of this embodiment has good crystallinity of the active layer (especially the channel forming region), and shows high electric field effect mobility, and small subthreshold coefficient. Therefore a transistor with fast operating speed may be formed.

Note that, the structure of this embodiment may be implemented in combination with any of the structures of Embodiments 1 to 3.

Embodiment 5

In this embodiment, a case of manufacturing an active matrix type light emitting device with a manufacturing method different to that of Embodiment 1 is described.

In Embodiment 1, the process of forming the first inorganic insulating film 256, the process of activation, the process of forming the second inorganic insulating film 257, and the process of heat treatment at 350 to 450° C. are performed in this order, but the order may be switched.

First, the process of forming the first inorganic insulating film 256, the process of forming the second inorganic insulating film 257, the process of activation, and the process of heat treatment at 350 to 450° C. may be performed in that order.

Further, the process of forming the first inorganic insulating film 256 may be omitted, so that the process of forming the second inorganic insulating film 257, the process of activation, and the process of heat treatment at 350 to 450° C. may be performed in that order.

Further, the process of forming the first inorganic insulating film 256 may be omitted, so that the process of activation, the process of forming the second inorganic insulating film 257, and the process of heat treatment at 350 to 450° C. may be performed in that order.

Note that, the structure of this embodiment may be implemented in combination with any of the structures of Embodiments 1 to 4.

Embodiment 6

In this embodiment, an example of combining the use of an organic compound which emits light by a singlet exciton (singlet) (hereinafter, referred to as a singlet compound), and an organic compound which emits light by a triplet exciton (triplet) (hereinafter, referred to as a triplet compound) as a light emitting layer is described. Note that, a singlet compound refers to a compound which emits light through only a singlet excitation, and a triplet compound refers to a compound which emits light through a triplet excitation.

As a triplet compound, the organic compounds disclosed in the articles below may be given as typical materials.

(1) T. Tsutsui, C. Adachi, S. Saito, Photochemical Processes in Organized Molecular Systems, ed. K. Honda, (Elsevier Sci. Pub., Tokyo, 1991) p. 437.

(2) M. A. Baldo, D. F. O'Brien, Y. You, A. Shoustikov, S. Sibley, M. E. Thompson, S. R. Forrest, Nature 395 (1998) p. 151.

In these articles there are disclosed organic compounds shown by the following formulas.

(3) M. A. Baldo, S. Lamansky, P. E. Burrows, M. E. Thompson, S. R. Forrest, Appl. Phys. Lett., 75 (1999) p.4.

(4) T. Tsutsui, M. J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.

Further, the present inventors consider that not only the light emitting materials disclosed in the above articles, but also the light emitting materials shown by the following molecular formulas (specifically, a metal complex or an organic compound) may be used.

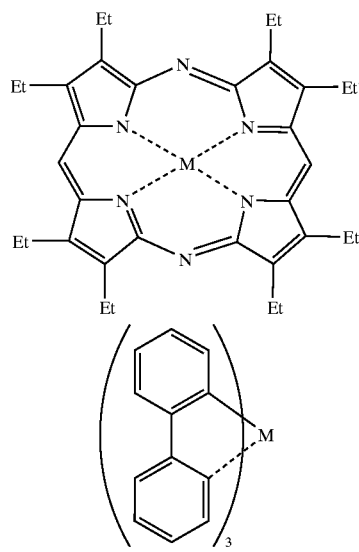

In the above molecular formulas, M is an element belonging to groups 8 to 10 of the periodic table. In the above articles, platinum and iridium are used. Further, the present inventors consider that since nickel, cobalt or palladium is cheaper than platinum or iridium, they are more preferable in reducing the manufacturing cost of the light emitting device. Especially, since nickel can easily form a complex, productivity is high and therefore preferable.

The above-mentioned triplet compound has higher luminous efficiency than the singlet compound, and in obtaining the same light emitting brightness, the operation voltage (a voltage necessary for an EL element to emit light) may be decreased. This embodiment makes use of this feature.

Figure 10:
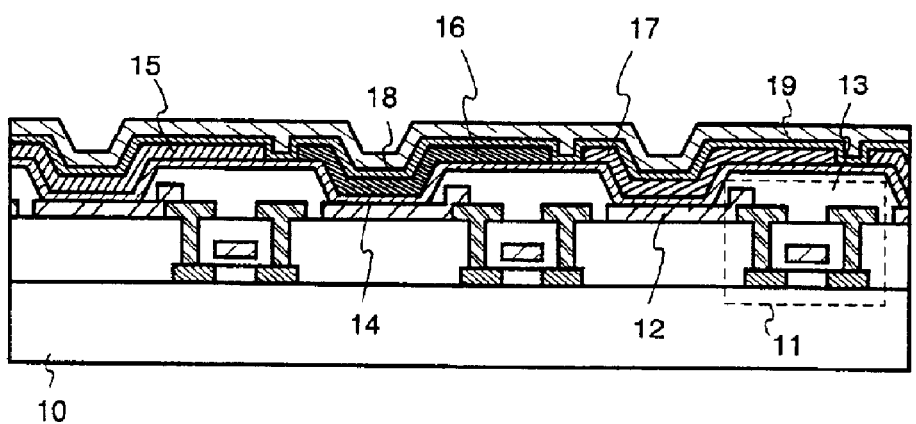
FIG. 10 is a view showing a cross sectional structure of a light emitting device.

FIG. 10 shows a cross sectional structure of the pixel portion of the active matrix type light emitting device of this embodiment. In FIG. 10, reference numeral 10 shows an insulator, reference numeral 11 shows a current control transistor 604 of FIG. 4B, reference numeral 12 shows a pixel electrode (anode), reference numeral 13 shows a bank, reference numeral 14 shows a known hole injecting layer, reference numeral 15 shows a light emitting layer which emits red color, reference numeral 16 shows a light emitting layer which emits green color, reference numeral 17 shows a light emitting layer which emits blue color, reference numeral 18 shows a known electron transporting layer, and reference numeral 19 shows a cathode.

Here in this embodiment, a triplet compound is used as a light emitting layer 15 which emits red color, and a singlet compound is used as a light emitting layer 16 which emits green color and a light emitting layer 17 which emits blue color. That is, an EL element using a singlet compound is an EL element which emits green color or blue color, and an EL element using the above-mentioned triplet compound is an EL element which emits red color.

When a low molecular organic compound is used as a light emitting layer, at present the life of a light emitting layer which emits red color is shorter than a light emitting layer which emits other colored light. This is because the luminous efficiency is lower than that of other colors, and in order to obtain the same light emitting brightness as other colors, the operation voltage has to be set higher and thus progress of deterioration is fast.

However, in this embodiment since a triplet compound with high luminous efficiency is used as the light emitting layer 15 which emits red color, the same light emitting brightness as the light emitting layer 16 which emits green color and the light emitting layer 17 which emits blue color may be obtained while the operation voltage is made the same. Accordingly, the deterioration of the light emitting layer 15 which emits red color does not progress significantly, and color display may be performed without causing a problem such as color shift. Further, suppression of the operation voltage is preferable considering that the margin of the peak inverse voltage of the transistor may be set low.

Note that, in this embodiment an example of using a triplet compound as the light emitting layer 15 which emits red color is shown, and a triplet compound may be used as the light emitting layer 16 which emits green color or the light emitting layer 17 which emits blue color.

A circuit structure of the pixel portion in the case this embodiment is implemented is shown in FIG. 11. Note that, here the pixel (pixel (red)) 20a which includes an EL element which emits red color, the pixel (pixel (green)) 20b which includes an EL element which emits green color, and the pixel (pixel (blue)) 20c which includes an EL element which emits blue color are shown, and all have the same circuit structure.

Figure 11A:
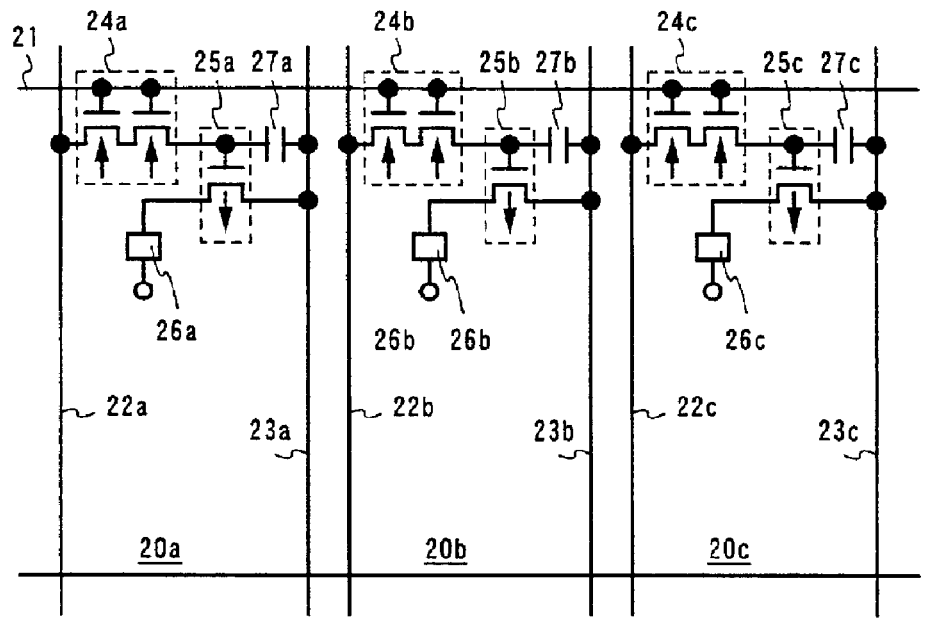
FIGS. 11A and 11B are views each showing a circuit structure of a pixel of a light emitting device.

In FIG. 11A, reference numeral 21 denotes a gate wiring line, reference numerals 22a to 22c denote source wiring lines (data wiring lines), and reference numerals 23a to 23c denote current supply wiring lines. The current supply wiring lines 23a to 23c are wiring lines for determining the operation voltage of the EL element, and the same voltage is applied to any of the pixel 20a which emits red color, the pixel 20b which emits green color and the pixel 20c which emits blue color. Therefore, the line width (thickness) of the wiring lines may all have the same design.

Further, reference numerals 24a to 24c denote switching transistors, and here are formed of n-channel transistors. Note that, a structure having two channel forming regions in between the source region and the drain region is illustrated here, but a structure with two or more, or one channel forming region may be used.

Further, symbols 25a to 25c are current control transistors, and a gate is connected to any of the switching transistors 24a to 24c, a source is connected to any of the current supplying lines 23a to 23c, and a drain is connected to any of EL elements 26a to 26c. Note that, symbols 27a to 27c are capacitors, which hold a voltage to be applied to the gate of the respective current supply lines 25a to 25c. However, the capacitors 27a to 27c may be omitted.

Note that, FIG. 11A shows an example where switching transistors 24a to 24c formed of n-channel transistors and current control transistors 25a to 25c formed of p-channel transistors are provided. However, as shown in FIG. 11B, switching transistors 28a to 28c formed of p-channel transistors and current control transistors 29a to 29c formed of n-channel transistors may be provided in the pixel (red) 30a, the pixel (green) 30b and the pixel (blue) 30c, respectively.

Figure 11B:
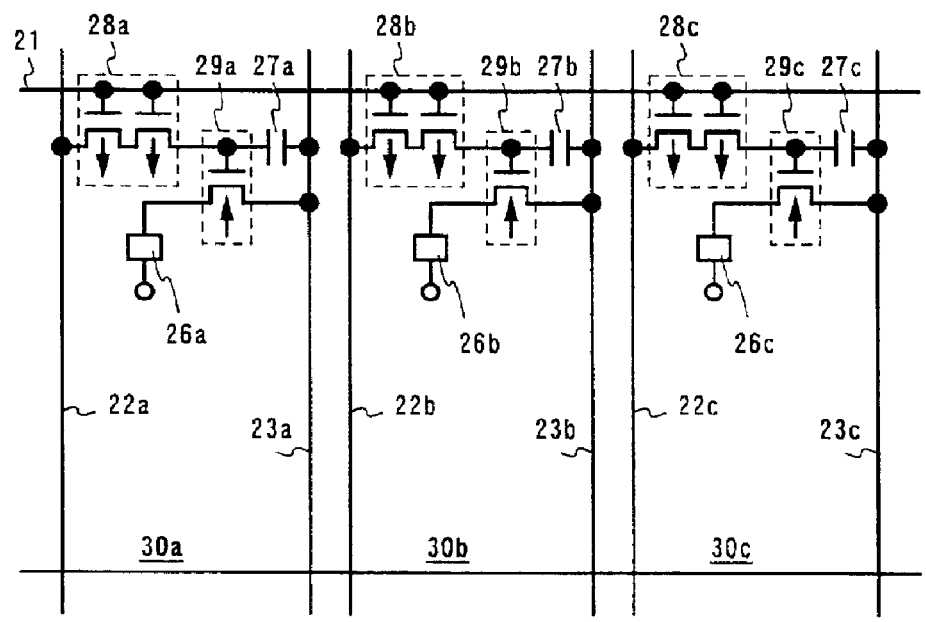

Further, in FIGS. 11A and 11B, an example of providing two transistors in one pixel is shown, but the number of transistors may be two or more (typically 3 to 6). In such a case, the n-channel transistor and the p-channel transistor may be provided by combining them in any way.

In this embodiment, an EL element 26a is an EL element which emits red color, and uses a triplet compound as the light emitting layer. Further, an EL element 26b is an EL element which emits green color, and an EL element 26c is an EL element which emits blue color, and both use a singlet compound as the light emitting layer.

In this way, by using the triplet compound and the singlet compound properly, the operation voltage of the EL elements 26a to 26c may all be made the same (10V or less, preferably 3 to 10 V). Accordingly, since the power source necessary for a light emitting device may be made the same at for example 3V or 5V, there is an advantage that the circuit design may be easily made.

Note that, the structures of this embodiment may be implemented in combination with any of the structures of Embodiments 1 to 5.

Embodiment 7

In this embodiment, a case where the pixel portion and the driver circuit are all formed by the n-channel transistor is described. Note that, the manufacturing process of the n-channel transistor is in accordance with Embodiment 1, therefore a description thereof is omitted.

Figure 12:
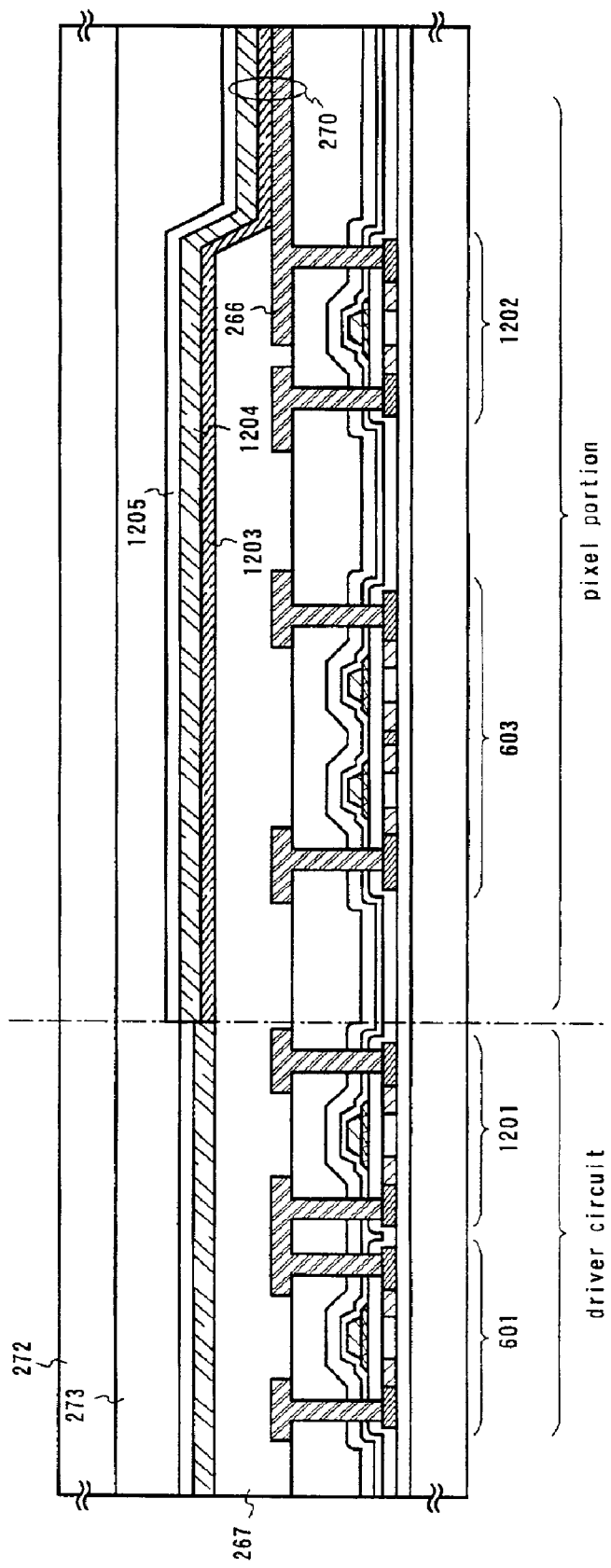
FIG. 12 is a view showing a cross sectional structure of a light emitting device.

A cross sectional structure of the light emitting device of this embodiment is shown in FIG. 12. Note that, the basic structures are the same as the cross sectional structure shown in FIG. 4B of Embodiment 1, so only the differences are described here.

In this embodiment, an n-channel transistors 1201 is provided in place of a p-channel transistor 602, and a current control transistor 1202 formed of an n-channel transistor is provided in place of a current control transistor 604.

Further, a wiring line 266 connected to the drain of the current control transistor 1202 functions as a cathode of an EL element, and an EL layer 1203, an anode 1204 formed of an oxide conductive film, and a passivation film 1205 are formed thereon. At this time, it is preferable that the wiring line 266 is formed of a metal film containing an element belonging to group 1 or 2 of the periodic table, or at least the surface contacting the EL layer 1203 is formed of a metal film containing an element belonging to group 1 or 2 of the periodic table.

Further, the n-channel transistor used in this embodiment may be all enhancement type transistors, or may be depression type transistors. Of course, it is possible to make both and combine them for use.

Figure 13:
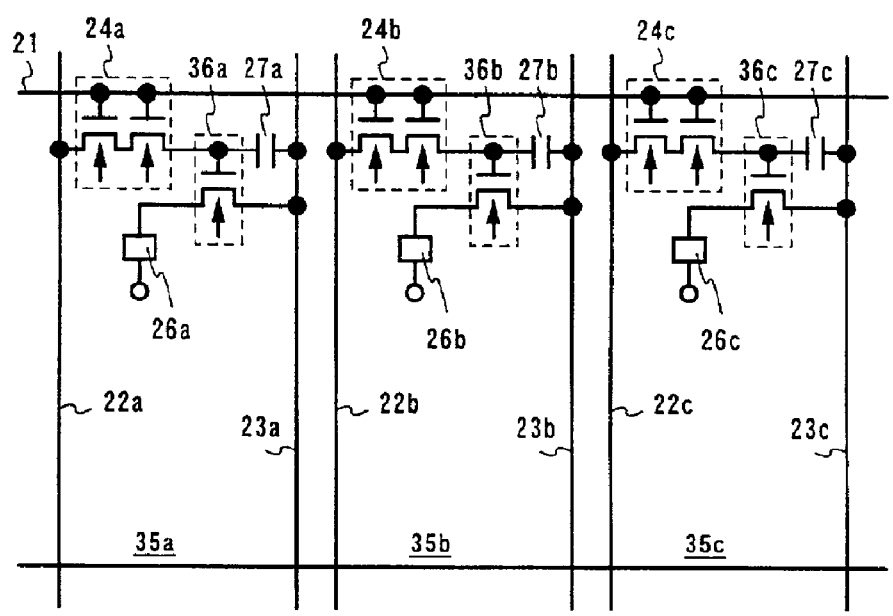
FIG. 13 is a view showing a circuit structure of a pixel of a light emitting device.

Here, the circuit structure of a pixel is shown in FIG. 13. Note that, for the portion where the same symbols as FIG. 11 is used, the description of FIG. 11 may be referred to.

As shown in FIG. 13, the switching transistors 24a to 24c provided in the pixel (red) 35a, the pixel (green) 35b, and the pixel (blue) 35c, respectively, and the current control transistors 35a to 35c are all formed of n-channel transistors.

According to the structure of this embodiment, in the manufacturing process of the light emitting device of Embodiment 1, since the photolithography process for forming a p-channel transistor and the photolithography process for forming a pixel electrode (anode) may be omitted, it is possible to further simplify the manufacturing process.

Note that, the structure of this embodiment may be implemented by combining any of the structures of Embodiments 1 to 6.

Embodiment 8

Figure 14:
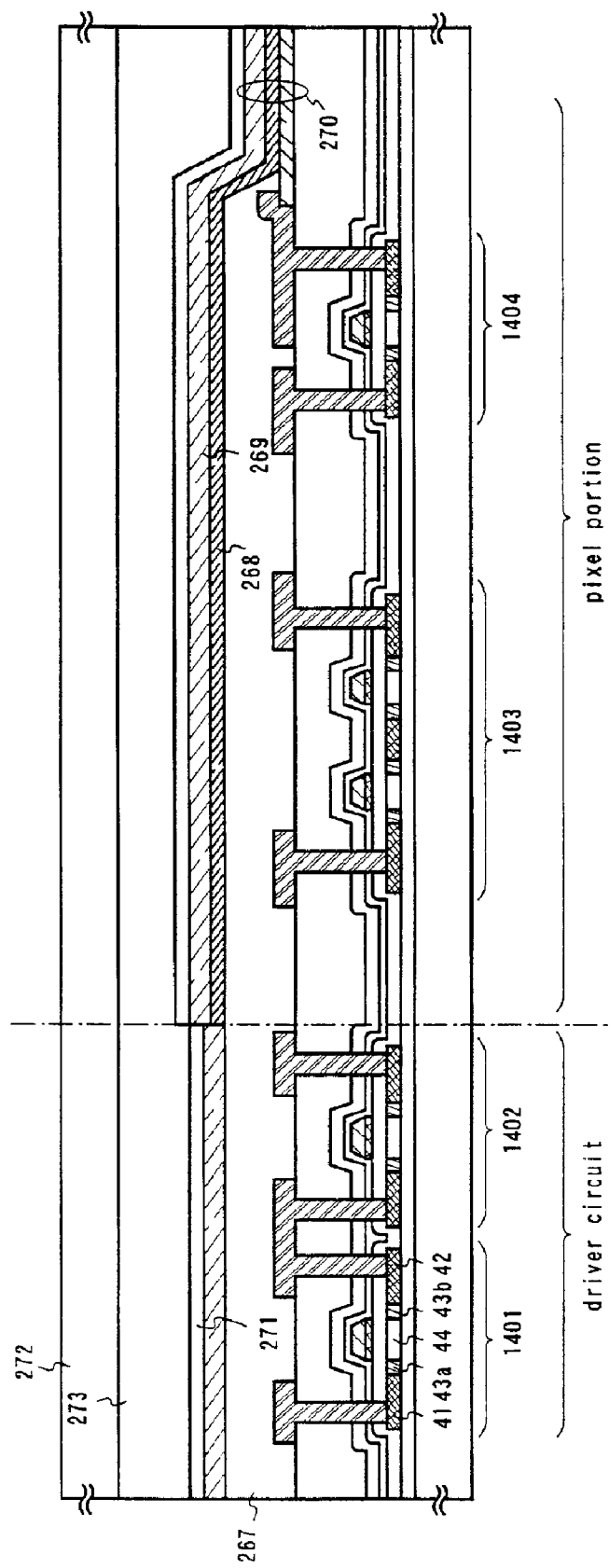
FIG. 14 is a view showing a cross sectional structure of a light emitting device.

In this embodiment, a case where the pixel portion and the driving circuit are all formed by a p-channel transistor is described. A cross sectional structure of a light emitting device of this embodiment is shown in FIG. 14. Note that, a portion with the same symbol as in FIG. 4B of Embodiment 1 may refer to the description of Embodiment 1.

In this embodiment, the driving circuit is formed of a PMOS circuit formed of a p-channel transistor 1401 and a p-channel transistor 1402, and the pixel portion has a switching transistor 1403 formed of a p-channel transistor and a current control transistor 1404 formed of a p-channel transistor. Note that, the active layer of the p-channel transistor 1401 includes the source region 41, the drain region 42, the LDD regions 43a and 43b and the channel forming region 44. The structure of the active layer is the same as in the p-channel transistor 1402, the switching transistor 1403 and the current control transistor 1404.

Here, the manufacturing process of the p-channel transistor of this embodiment is described by referring to FIG. 15. First, the process until FIG. 2B is described in accordance with the manufacturing process of Embodiment 1.

Figure 15A:
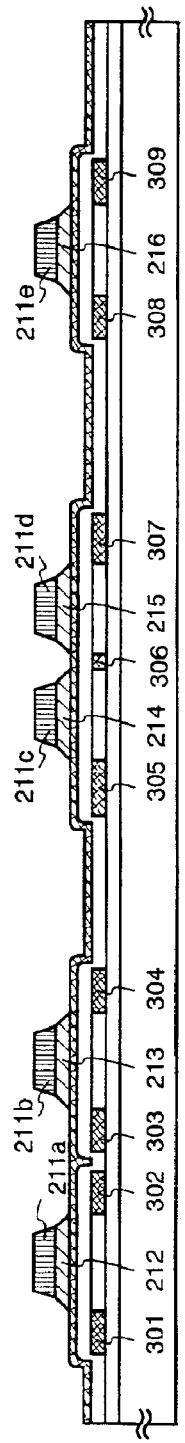
FIGS. 15A to 15C are views showing manufacturing steps of a light emitting device.

Next, electrodes 212 to 216 which are formed of a second conductive film are formed using resists 211a to 211e. Then, the resists 211a to 211e and the electrodes 212 to 216 formed of the second conductive film are used as masks and elements belonging to group 13 of the periodic table (in this embodiment, boron) are added to a semiconductor film, thereby forming regions (hereinafter, referred to as p-type impurity region (a)) 301 to 309 containing boron at a concentration of $1 \times 10^{20}$ to $1 \times 10^{21}$ atoms/cm$^3$ (FIG. 15A).

Figure 15B:
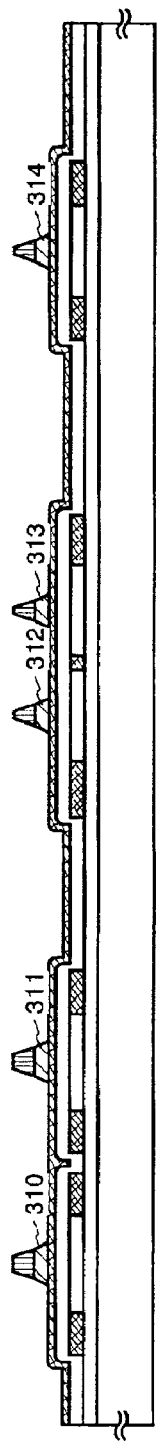

Next, the electrodes 212 to 216 formed of the second conductive film are etched using the resists 211a to 211e under the same etching conditions as in FIG. 1D, to thereby form the second gate electrodes 310 to 314 (FIG. 15B).

Next, the first conductive film 209 is etched under the same etching conditions as in FIG. 1C, with the resists 211a to 211e and the second gate electrodes 310 to 314 as masks, to thereby form first gate electrodes 315 to 319.

Figure 15C:
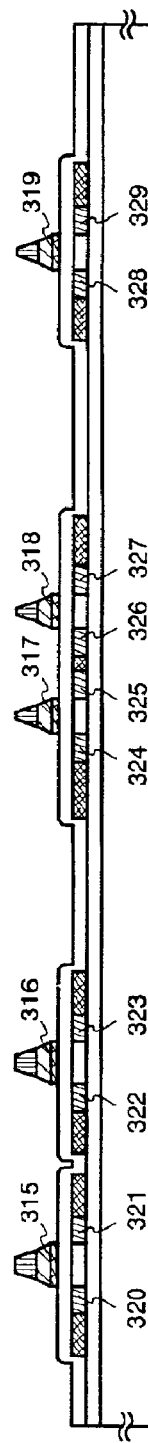

Then, the element belonging to group 13 of the periodic table (in this embodiment, boron) is doped into the semiconductor film, with the resists 211a to 211e and the second gate electrodes 310 to 314 as masks, to thereby form regions (hereinafter, referred to as a p-type impurity region (b)) 320 to 329 containing boron at a concentration of $1 \times 10^{16}$ to $1 \times 10^{19}$ atoms/cm$^3$ (typically, $1 \times 10^{17}$ to $1 \times 10^{18}$ atoms/cm$^3$) (FIG. 15C).

The processes thereafter are in accordance with the processes after FIG. 3C of Embodiment 1. With the above processes, the light emitting device of the structure shown in FIG. 14 can be formed.

Note that, the p-channel transistors used in this embodiment may all be enhancement type transistors, or may all be depletion type transistors. Of course, both may be formed and combined to be used.

Figure 16:
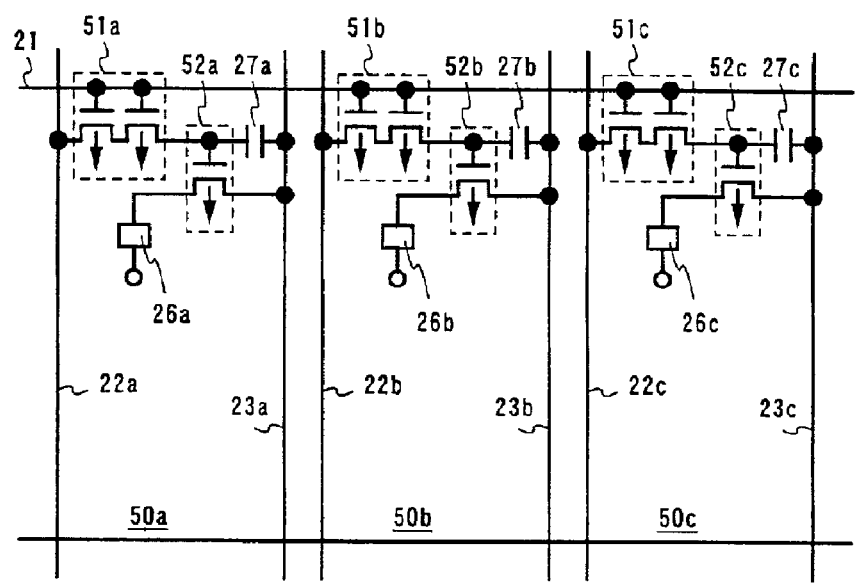
FIG. 16 is a view showing a circuit structure of a pixel of a light emitting device.

The circuit structure of the pixel is shown in FIG. 16. Note that, the portion with the same symbols as in FIG. 11 may refer to the description of FIG. 11.

As shown in FIG. 16, the switching transistors 51a to 51c and the current control transistors 52a to 52c provided respectively in a pixel (red) 50a, a pixel (green) 50b, and a pixel (blue) 50c are all formed of p-channel transistors.

According to the structure of this embodiment, since the first photolithography process in the manufacturing process of the light emitting device of Embodiment 1 may be omitted, the manufacturing process may be simplified more than in Embodiment 1.

Note that, the structure of this embodiment may be implemented in combination with any of the structures of Embodiments 1 to 6.

Embodiment 9

The active matrix type light emitting device of this invention may use, as a semiconductor element, a MOS (Metal Oxide Semiconductor) transistor. In such a case, a MOS transistor formed with a known method may be used as the semiconductor substrate (typically, a silicon wafer).

Note that, the structure of this embodiment may be implemented in combination with the structures of Embodiments 1 to 3, and 5 to 8.

Embodiment 10

In Embodiment 1, a driving circuit built-in light emitting device shown in FIG. 5 is an example of a pixel portion and a driving circuit integrally formed on the same insulator, but a driving circuit may also be provided with an externally mounted IC (integrated circuit). In such a case, the structure is as shown in FIG. 17A.

Figure 17A:
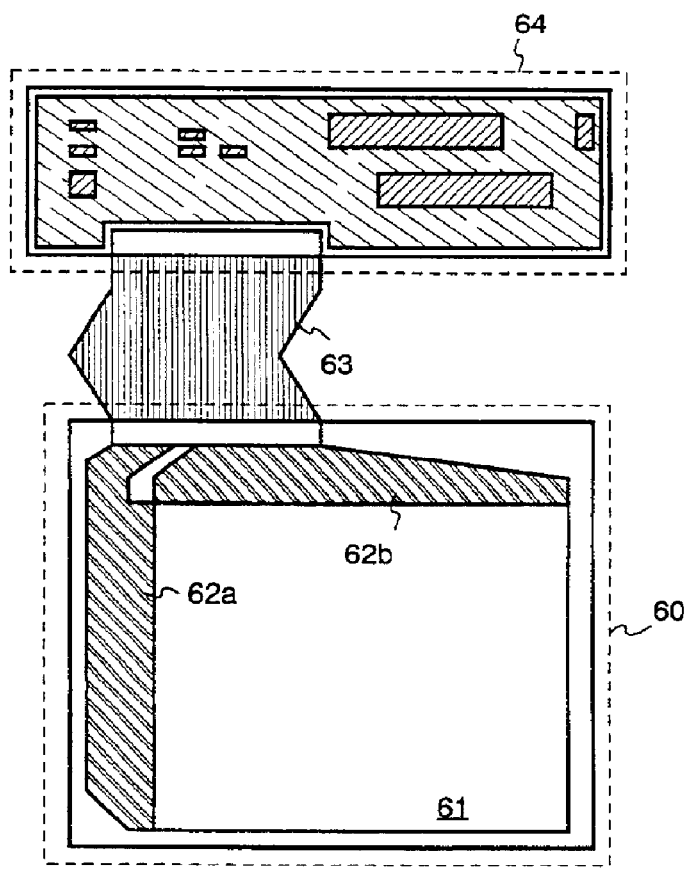
FIGS. 17A and 17B are views each showing a structure of a light emitting device having an external driving circuit.

In the module shown in FIG. 17A, an FPC 63 is mounted on an active matrix substrate 60 (including a pixel portion 61, wiring 62a and 62b), and a printed wiring board 64 is mounted through the FPC 63. Here, the functional block diagram of the printed wiring board 64 is shown in FIG. 17B.

Figure 17B:
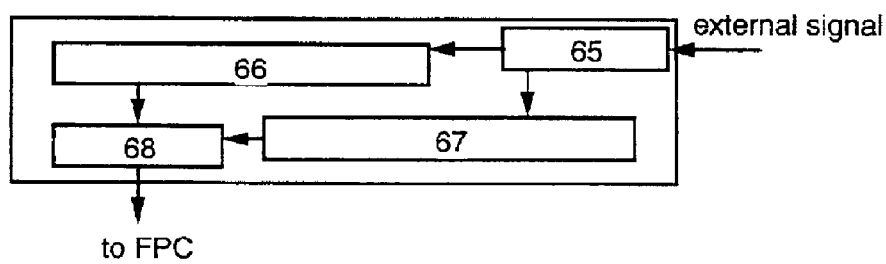

As shown in FIG. 17B, the printed wiring board 64 is provided with at least I/O ports (also referred to as an input or output portion) 65 and 68, and an IC which functions as a source side driver circuit 66 and a gate side driver circuit 67.

In this way, a module with a structure where an active matrix substrate formed with a pixel portion on the substrate surface is mounted with an FPC, and a structure where a printed wiring board having a function as a driving circuit through the FPC is referred to as a light emitting module having an external driving circuit particularly throughout this specification.

Figure 18A:
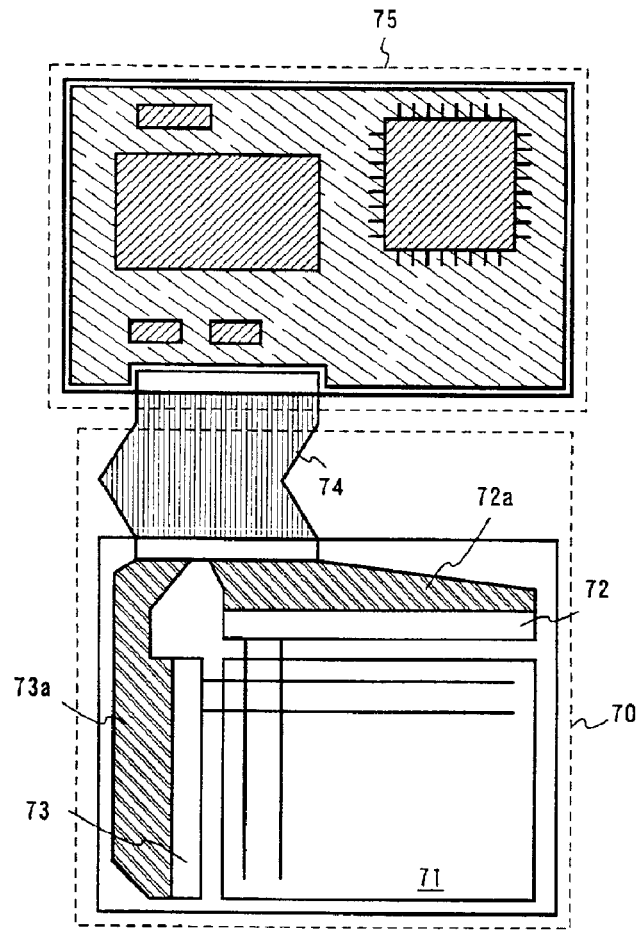
FIGS. 18A and 18B are views each showing a structure of a light emitting device having an external controller.

Further, in the module shown in FIG. 18A, a driving circuit built-in light emitting device 70 (including a pixel portion 71, a source side driving circuit 72, a gate side driving circuit 73, wiring lines 72a and 73a) is mounted with an FPC 74, and a printed wiring board 75 is mounted through the FPC 74. The functional block diagram of a printed wiring board 75 is shown in FIG. 18B.

Figure 18B:
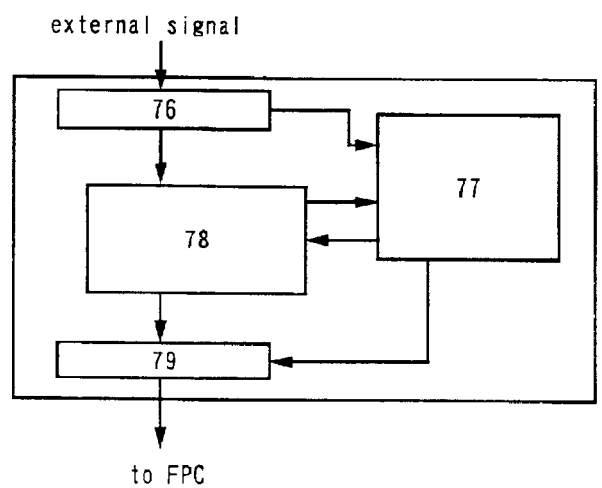

As shown in FIG. 18B, the printed wiring board 75 is provided with at least an I/O port 76 and 79, and an IC which functions as a control portion 77. Note that here a memory portion 78 is provided, but it is not always necessary. Further, the control portion 77 is a portion having a function for controlling the driving circuit, correcting picture data, and the like.

A module with a structure where a driving circuit built-in light emitting device formed with a pixel portion and a driving circuit on the board surface is mounted with a printed wiring board having a function as a controller in this way, is referred to as a light emitting module with an external controller particularly in this specification.

Embodiment 11

The light-emitting device (including the module at the state of which is shown in Embodiment 10) formed by implementing this invention may be used as a display portion of various electrical appliances. As electrical appliances of this invention, there are such as an image playback device with a video camera, a digital camera, a goggle type display (head mounted display), a car navigation system, an audio apparatus, a note type personal computer, a game apparatus, a portable information terminal (such as a mobile computer, a portable telephone, a portable game apparatus or an electronic book), and an image reproduction device providing a recording medium. Specific examples of the electronic equipment are shown in FIGS. 19 and 20.

Figure 19A:
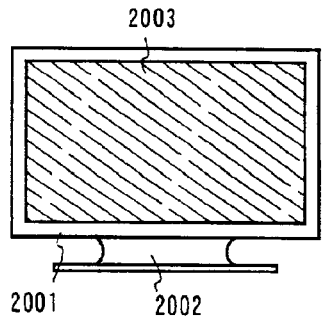
FIGS. 19A to 19F are views showing specific examples of electric instruments.

FIG. 19A shows an EL display and includes a casing 2001, a supporting base 2002 and a display portion 2003. The light-emitting device of this invention may be used for the display portion 2003. When using the light-emitting device having the EL element in the display portion 2003, since the EL element is a self-light emitting type backlight is not necessary and the display portion may be made thin.

Figure 19B:
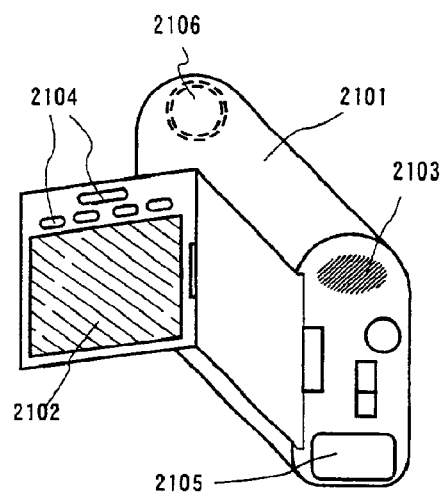

FIG. 19B shows a video camera, which contains a main body 2101, a display portion 2102, a sound input portion 2103, operation switches 2104, a battery 2105, and an image receiving portion 2106. The light-emitting device of this invention can be applied to the display portion 2102.

Figure 19C:
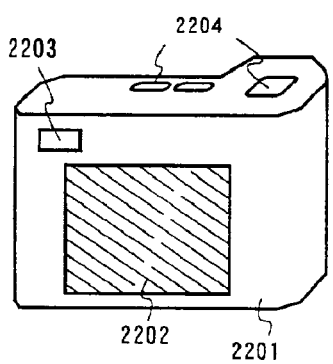

FIG. 19C shows a digital camera, which contains a main body 2201, a display portion 2202, an eye contact portion 2203, and operation switches 2204. The light emitting-device and the liquid crystal display device of this invention can be applied to the display portion 2202.

Figure 19D:
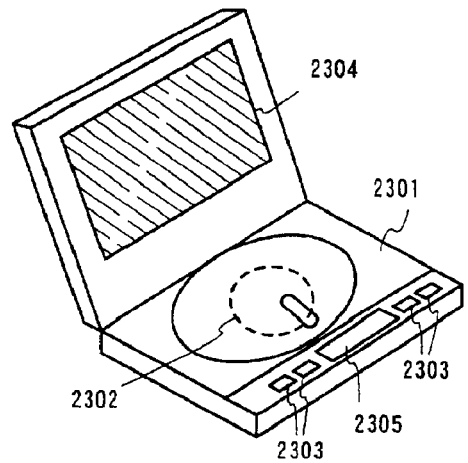

FIG. 19D shows an image playback device equipped with a recording medium (specifically, a DVD playback device), which contains a main body 2301, a recording medium (such as a CD, LD or DVD) 2302, operation switches 2303, a display portion (a) 2304, a display portion (b) 2305 and the like. The display portion (a) is mainly used for displaying image information. The display portion (b) 2305 is mainly used for displaying character information. The light-emitting device of this invention can be applied to the display portion (a) and the display portion (b). Note that, the image playback device equipped with the recording medium includes devices such as CD playback device, and game machines.

Figure 19E:
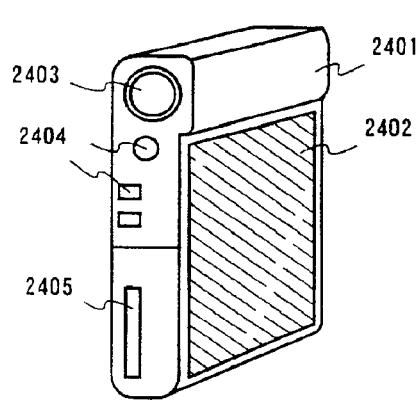

FIG. 19E shows a portable (mobile) computer, which contains a main body 2401, a display portion 2402, an image receiving portion 2403, operation switches 2404 and a memory slot 2405. The light-emitting device of this invention can be applied to the display portion 2402. This portable computer may record information to a recording medium that has accumulated flash memory or involatile memory, and playback such information.

Figure 19F:
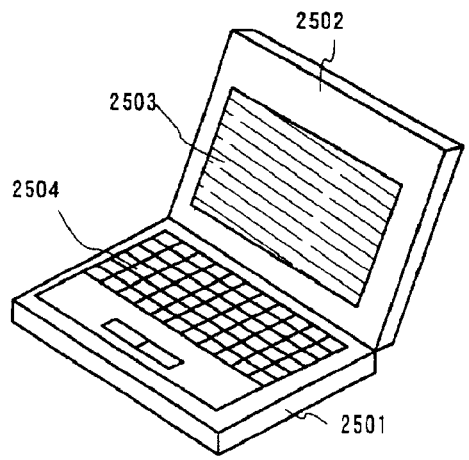

FIG. 19F shows a personal computer, which contains a main body 2501, a casing 2502, a display portion 2503, and a keyboard 2504. The light-emitting device of this invention can be applied to the display portion 2503.

The above electronic appliances more often display information sent through electron communication circuits such as the internet or the CATV (cable television), and especially image information display is increasing. When using the light-emitting device having the EL element in the display portion, since the response speed of the EL element is extremely fast, it becomes possible to display pictures without delay.

Further, since the light emitting portion of the light-emitting device consumes power, it is preferable to display information so that the light emitting portion is as small as possible. Therefore, when using the light-emitting device in the portable information terminal, especially in the display portion where character information is mainly shown in a portable phone or an audio apparatus, it is preferable to drive so that the character information is formed of a light emitting portion with the non-light emitting portion as a background.

Figure 20A:
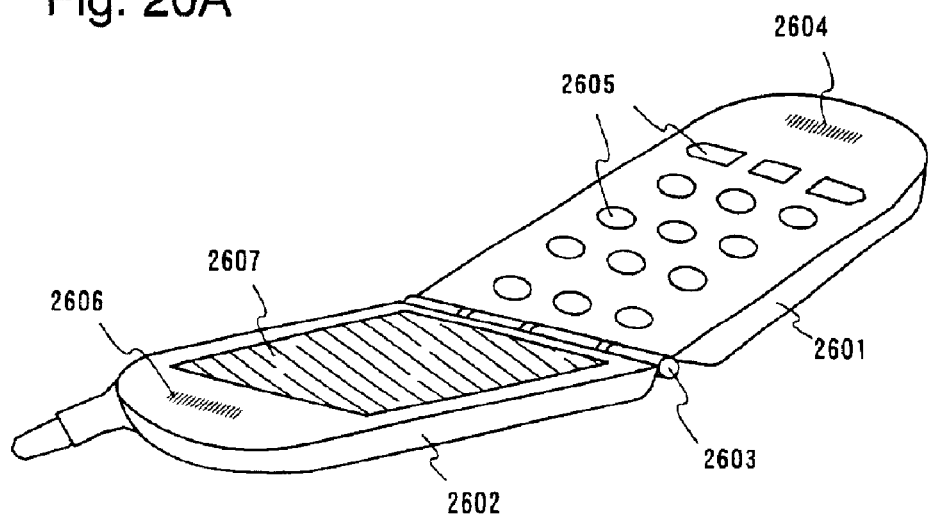
FIGS. 20A and 20B are views showing specific examples of electric instruments.

Here, FIG. 20A shows a portable telephone, and reference numeral 2601 shows a portion (operation portion) which performs key operation, and reference numeral 2602 shows a portion which performs information display (information display portion), and the operation portion 2601 and the information display portion 2602 are connected by the connecting portion 2603. Further, the operation portion 2601 is provided with a sound input portion 2604, operation switches 2605, and the information display potion 2602 is provided with a sound output portion 2606, a display portion 2607.

The light-emitting device of this invention may be used as the display portion 2607. Note that, when using the light-emitting device to the display portion 2607, the consumption power of the portable telephone may be suppressed by displaying white letters in the background of the black color.

In the case of the portable telephone shown in FIG. 20A, the light-emitting device used in the display portion 2604 is incorporated with a sensor by a CMOS circuit(a CMOS sensor), and may be used as an authentication system terminal for authenticating the user by reading the fingerprints or the hand of the user. Further, light emission may be performed by taking into consideration the brightness (illumination) of outside and making information display at a contrast that is already set.

Further, the low power consumption may be attained by decreasing the brightness when using the operating switch 2605 and increasing the brightness when the use of the operation switch is finished. Further, the brightness of the display portion 2604 is increased when a call is received, and low power consumption is attained by decreasing the brightness during a telephone conversation. Further, when using the telephone continuously, by making it have a function so that display is turned off by time control unless it is reset, low power consumption is realized. It should be noted that this control may be operated by hand.

Figure 20B:
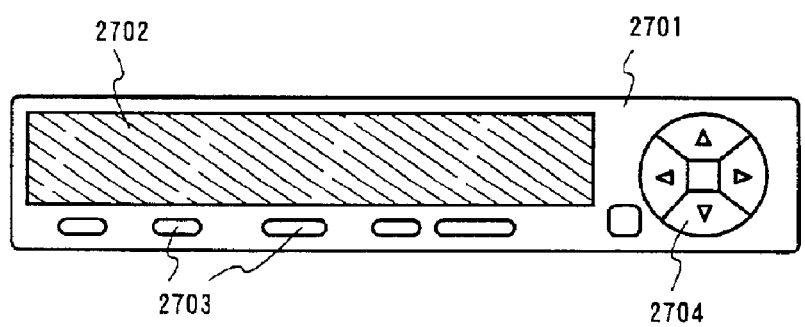

Further, FIG. 20B shows an audio, which contains a casing 2701, a display portion 2702, and operation switches 2703 and 2704. The light-emitting device of this invention can be applied to the display portion 2702. Further, in this embodiment, a car mounted audio (car audio) is shown, but it may be used in a fixed type audio (audio component). Note that, when using a light-emitting device in the display portion 2704, by displaying white characters in a black background, power consumption may be suppressed.

Further, electrical equipments shown above are incorporated with a light sensor in the light-emitting device which are used in the display portion, and it is possible to provide means to detect the brightness of the environment of use. When using the light-emitting device in the display portion, it is may have a function that modulates the light-emission brightness according to the brightness of the environment of use.

Specifically, this is implemented by providing an image sensor (surface shape, linear or a dotted sensor) formed by a CMOS circuit on the light-emitting device using the display portion, and providing a CCD (charge coupled device) on the main body or the casing. The user may recognize the image or the character information without trouble if a brightness of a contrast ratio of 100 to 150 may be maintained as compared to the brightness of the environment of use. Namely, in the case the environment of use is dark, it is possible to suppress the consumption power by suppressing the brightness of the image.

As in the above, the applicable range of this invention is extremely wide, and may be used for various electrical equipment. Further, the electrical equipment of this embodiment may use the light-emitting device and the module containing any of the structures of Embodiments 1 to 10.

By carrying out the present invention, a light emitting device can be manufactured at a high yield and a low cost, and an inexpensive light emitting device can be provided. Besides, it becomes possible to provide an inexpensive electric instrument by using the inexpensive light emitting device as a display portion.

What is claimed is:

1. A method of fabricating a light emitting device, comprising the steps of:

forming a semiconductor film on an insulator;

forming a gate insulating film covering the semiconductor film;

forming a first conductive film and a second conductive film on the gate insulating film;

forming an electrode made of the second conductive film by etching the second conductive film;

adding an n-type impurity element to the semiconductor film by self-alignment using the electrode made of the second conductive film as a mask;

forming an electrode made of the first conductive film by etching the first conductive film by self-alignment using the electrode made of the second conductive film as a mask after forming the electrode made of the second conductive film;

forming a second gate electrode by narrowing a line width of the electrode made of the second conductive film by etching;

adding an n-type impurity element to the semiconductor film by self-alignment using the second gate electrode as a mask; and forming a first gate electrode by narrowing a line width of the electrode made of the first conductive film by etching.

2. A method of fabricating a light emitting device, comprising the steps of:

forming a semiconductor film on an insulator;

forming a gate insulating film covering the semiconductor film;

forming a first conductive film and a second conductive film on the gate insulating film;

forming an electrode made of the second conductive film by etching the second conductive film;

adding an n-type impurity element to the semiconductor film by using the electrode made of the second conductive film as a mask and by making the n-type impurity element pass through the first conductive film;

forming an electrode made of the first conductive film by etching the first conductive film by self-alignment using the electrode made of the second conductive film as a mask;

forming a second gate electrode by narrowing a line width of the electrode made of the second conductive film by etching;

adding an n-type impurity element to the semiconductor film by using the second gate electrode as a mask and by making the n-type impurity element pass through the electrode made of the first conductive film; and forming a first gate electrode by narrowing a line width of the electrode made of the first conductive film by etching.

3. A method of fabricating an electrical appliance having a light emitting device, comprising the steps of:

forming a semiconductor film on an insulator;

forming a gate insulating film covering the semiconductor film;

forming a first conductive film and a second conductive film on the gate insulating film; forming an electrode made of the second conductive film by etching the second conductive film;

adding an impurity element to the semiconductor film by self-alignment using the electrode made of the second conductive film as a mask;

forming an electrode made of the first conductive film by etching the first conductive film by self-alignment using the electrode made of the second conductive film as a mask after forming the electrode made of the second conductive film;

forming a second gate electrode by narrowing a line width of the electrode made of the second conductive film by etching;

adding an impurity element to the semiconductor film by self-alignment using the second gate electrode; and forming a first gate electrode by narrowing a line width of the electrode made of the first conductive film by etching.

4. A method of fabricating an electrical appliance having a light emitting device, comprising the steps of:

forming a semiconductor film on an insulator;

forming a gate insulating film covering the semiconductor film;

forming a first conductive film and a second conductive film on the gate insulating film;

forming an electrode made of the second conductive film by etching the second conductive film;

adding an n-type impurity element to the semiconductor film by using the electrode made of the second conductive film as a mask and by making the n-type impurity element pass through the first conductive film;

forming an electrode made of the first conductive film by etching the first conductive film by self-alignment using the electrode made of the second conductive film as a mask;

forming a second gate electrode by narrowing a line width of the electrode made of the second conductive film by etching;

adding an n-type impurity element to the semiconductor film by using the second gate electrode as a mask and by making the n-type impurity element pass through the electrode made of the first conductive film; and forming a first gate electrode by narrowing a line width of the electrode made of the first conductive film by etching.

5. A method of fabricating a light emitting device having at least one thin film transistor in a pixel portion, comprising the steps of:

forming a semiconductor film on an insulator;

forming a gate insulating film covering the semiconductor film;

forming a first conductive film and a second conductive film on the gate insulating film;

forming an electrode made of the second conductive film by etching the second conductive film;

adding a p-type impurity element to the semiconductor film by self-alignment using the electrode made of the second conductive film;

forming an electrode made of the first conductive film by etching the first conductive film by self-alignment using the electrode made of the second conductive film as a mask after forming the electrode made of the second conductive film;

forming a second gate electrode by narrowing a line width of the electrode made of the second conductive film by etching;

adding a p-type impurity element to the semiconductor film by self-alignment using the second gate electrode as a mask; and forming a first gate electrode by narrowing a line width of the electrode made of the first conductive film by etching.

6. A method of fabricating a light emitting device comprising the steps of:

forming a semiconductor film on an insulator;

forming a gate insulating film covering the semiconductor film;

forming a first conductive film and a second conductive film on the gate insulating film;

etching the second conductive film to form a patterned second conductive film;

adding an n-type impurity element to the semiconductor film by self-alignment using the patterned second conductive film as a mask;

etching the first conductive film to form a patterned first conductive film by self-alignment using the patterned second conductive film as a mask after etching the second conductive film;

forming a second gate electrode by narrowing a line width of the patterned second conductive film by etching;

adding an n-type impurity element to the semiconductor film by self-alignment using the second gate electrode as a mask; and forming a first gate electrode by narrowing a line width of the patterned first conductive film by etching.

7. A method of fabricating a light emitting device according to claim 1, wherein an n-type impurity region (a) is formed at the former adding step, and an n-type impurity region (b) is formed at the latter adding step.

8. A method of fabricating a light emitting device according to claim 2, wherein an n-type impurity region (a) is formed at the former adding step, and an n-type impurity region (b) is formed at the latter adding step.

9. A method of fabricating an electrical appliance having a light emitting device according to claim 3, wherein an n-type impurity region (a) is formed at the former adding step, and an n-type impurity region (b) is formed at the latter adding step.

10. A method of fabricating an electrical appliance having a light emitting device according to claim 4, wherein an n-type impurity region (a) is formed at the former adding step, and an n-type impurity region (b) is formed at the latter adding step.

11. A method of fabricating a light emitting device according to claim 5, wherein an n-type impurity region (a) is formed at the former adding step, and an n-type impurity region (b) is formed at the latter adding step.

12. A method of fabricating a light emitting device according to claim 6, wherein an n-type impurity region (a)

is formed at the former adding step, and an n-type impurity region (b) is formed at the latter adding step.

13. A method of fabricating a light emitting device according to claim 7, wherein a part of the n-type impurity region (b) overlaps the first gate electrode through the gate insulating film.

14. A method of fabricating a light emitting device according to claim 8, wherein a part of the n-type impurity region (b) overlaps the first gate electrode through the gate insulating film.

15. A method of fabricating a light emitting device according to claim 9, wherein a part of the n-type impurity region (b) overlaps the first gate electrode through the gate insulating film.

16. A method of fabricating a light emitting device according to claim 10, wherein a part of the n-type impurity region (b) overlaps the first gate electrode through the gate insulating film.

17. A method of fabricating a light emitting device according to claim 11, wherein a part of the n-type impurity region (b) overlaps the first gate electrode through the gate insulating film.

18. A method of fabricating a light emitting device according to claim 12, wherein a part of the n-type impurity region (b) overlaps the first gate electrode through the gate insulating film.

19. A method of fabricating a light emitting device according to claim 1, wherein the first conductive film is a tantalum nitride film, and the second conductive film is a tungsten film.

20. A method of fabricating a light emitting device according to claim 2, wherein the first conductive film is a tantalum nitride film, and the second conductive film is a tungsten film.

21. A method of fabricating an electrical appliance having a light emitting device according to claim 3, wherein the first conductive film is a tantalum nitride film, and the second conductive film is a tungsten film.

22. A method of fabricating an electrical appliance having a light emitting device according to claim 4, wherein the first conductive film is a tantalum nitride film, and the second conductive film is a tungsten film.

23. A method of fabricating a light emitting device according to claim 5, wherein the first conductive film is a tantalum nitride film, and the second conductive film is a tungsten film.

24. A method of fabricating a light emitting device according to claim 6, wherein the first conductive film is a tantalum nitride film, and the second conductive film is a tungsten film.

25. A method of fabricating a light emitting device according to claim 1, wherein the first conductive film is a tungsten film, and the second conductive film is an aluminum alloy film.

26. A method of fabricating a light emitting device according to claim 2, wherein the first conductive film is a tungsten film, and the second conductive film is an aluminum alloy film.

27. A method of fabricating an electrical appliance having a light emitting device according to claim 3, wherein the first conductive film is a tungsten film, and the second conductive film is an aluminum alloy film.

28. A method of fabricating an electrical appliance a light emitting device according to claim 4, wherein the first conductive film is a tungsten film, and the second conductive film is an aluminum alloy film.

29. A method of fabricating a light emitting device according to claim 5, wherein the first conductive film is a tungsten film, and the second conductive film is an aluminum alloy film.

30. A method of fabricating a light emitting device according to claim 6, wherein the first conductive film is a tungsten film, and the second conductive film is an aluminum alloy film.

31. A method of fabricating an electrical appliance having a light emitting device according to claim 3, wherein said electrical appliance is an appliance selected from the group consisting of: a video camera, a digital camera, a DVD, a portable computer, a personal computer, a portable telephone and an audio.

32. A method of fabricating an electrical appliance having a light emitting device according to claim 4, wherein said electrical appliance is an appliance selected from the group consisting of: a video camera, a digital camera, a DVD, a portable computer, a personal computer, a portable telephone and an audio.

* * * * *